(12) United States Patent
Ding et al.

(10) Patent No.: US 10,892,318 B2
(45) Date of Patent: Jan. 12, 2021

(54) SEMICONDUCTOR DEVICE AND METHOD FOR FABRICATING THE SAME

(71) Applicant: Samsung Electronics Co., Ltd., Suwon-si (KR)

(72) Inventors: Shaofeng Ding, Suwon-si (KR); Jeong Hoon Ahn, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/379,016

(22) Filed: Apr. 9, 2019

(65) Prior Publication Data

US 2020/0075712 A1 Mar. 5, 2020

(30) Foreign Application Priority Data

Aug. 31, 2018 (KR) .................. 10-2018-0103545

(51) Int. Cl.
*H01L 23/522* (2006.01)
*H01L 29/49* (2006.01)
*H01L 23/48* (2006.01)
*H01L 49/02* (2006.01)
*H01L 21/768* (2006.01)

(52) U.S. Cl.
CPC ........ *H01L 28/60* (2013.01); *H01L 21/76832* (2013.01); *H01L 23/481* (2013.01); *H01L 23/5223* (2013.01); *H01L 23/5226* (2013.01); *H01L 29/4966* (2013.01)

(58) Field of Classification Search
CPC ............... H01L 28/60; H01L 23/5223; H01L 21/76832; H01L 23/5226; H01L 29/4966; H01L 23/481

USPC ........ 257/532, 533, 534, 536; 438/255, 398, 438/665, 957
See application file for complete search history.

(56) References Cited

U.S. PATENT DOCUMENTS

| | | |
|---|---|---|
| 7,534,692 B2 | 5/2009 | Jagueneau et al. |
| 8,803,286 B2 | 8/2014 | Jou et al. |
| 8,866,260 B2 | 10/2014 | Shieh et al. |
| 9,324,780 B2 | 4/2016 | Jen et al. |
| 9,401,395 B2 | 7/2016 | Tzeng et al. |
| 9,577,025 B2 | 2/2017 | Gu et al. |
| 9,954,051 B2 | 4/2018 | See et al. |

(Continued)

FOREIGN PATENT DOCUMENTS

JP 2007-221036 A 8/2007

*Primary Examiner* — Thinh T Nguyen
(74) *Attorney, Agent, or Firm* — Harness, Dickey & Pierce, P.L.C.

(57) ABSTRACT

Semiconductor devices including a capacitor in which electrostatic capacity is improved by a simplified process and/or methods for fabricating the same are provided. The semiconductor device including an insulating structure defining a first trench on a substrate, a first conductive layer in the insulating structure, a first portion of an upper surface of the first conductive layer exposed by the first trench, a capacitor structure including a first electrode pattern on the first conductive layer, a dielectric pattern on the first electrode pattern, and a second electrode pattern on the dielectric pattern, the first electrode pattern extending along sidewalls and a bottom surface of the first trench and an upper surface of the insulating structure, and a first wiring pattern on the capacitor structure may be provided.

19 Claims, 28 Drawing Sheets

(56) References Cited

U.S. PATENT DOCUMENTS

| | | | |
|---|---|---|---|
| 2006/0024899 A1* | 2/2006 | Crenshaw et al. | ............................ H01L 23/5223 438/381 |
| 2016/0118301 A1 | 4/2016 | Yu et al. | |
| 2016/0372449 A1 | 12/2016 | Rusu et al. | |
| 2017/0194418 A1 | 7/2017 | Papavasiliou et al. | |
| 2017/0250159 A1 | 8/2017 | Lee | |

* cited by examiner

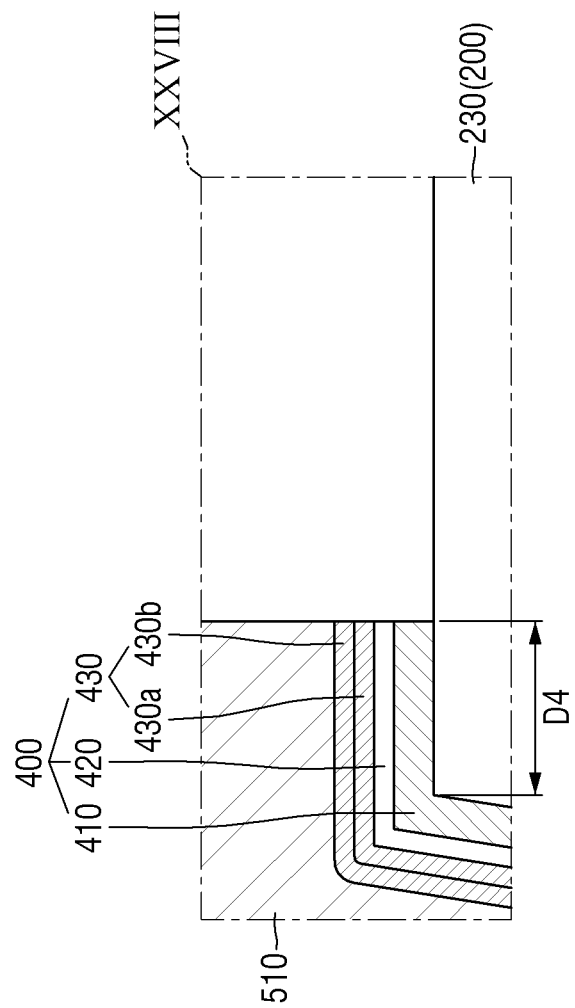

SEMICONDUCTOR DEVICE AND METHOD FOR FABRICATING THE SAME

This application claims priority to Korean Patent Application No. 10-2018-0103545, filed on Aug. 31, 2018, in the Korean Intellectual Property Office (KIPO), and all the benefits accruing therefrom under 35 U.S.C. § 119, the disclosure of which is incorporated herein by reference in its entirety.

BACKGROUND

1. Technical Field

The present inventive concepts relate to semiconductor devices and/or methods for fabricating the same. More specifically, the present inventive concepts relate to semiconductor devices including a capacitor structure and methods for fabricating the same.

2. Description of the Related Art

As the industry develops and multimedia develops, semiconductor devices used for computers, mobile equipment and the like have been highly integrated and have been improved in performance. In the case of a semiconductor device including a capacitor, while an area occupied by a unit cell decreases as a degree of integration increases, it is desired to maintain or increase an electrostatic capacitance of the capacitor.

A MIM (Metal-Insulator-Metal) capacitor which uses a high dielectric constant material as a dielectric film of the capacitor and uses a metal material as a lower electrode and an upper electrode has been developed.

SUMMARY

Some example embodiments of the present inventive concepts provide semiconductor devices including a capacitor in which electrostatic capacity is improved by a simplified process.

Some example embodiments of the present inventive concepts also provide methods for fabricating the semiconductor device including the capacitor in which electrostatic capacity is improved by a simplified process.

However, example embodiments of the present inventive concepts are not restricted to the one set forth herein. The above and other aspects of the present inventive concepts will become more apparent to one of ordinary skill in the art to which the present inventive concepts pertain by referencing the detailed description of some example embodiments given below.

According to an example embodiments of the present inventive concepts, a semiconductor device includes an insulating structure defining a first trench on a substrate, a first conductive layer in the insulating structure, a first portion of an upper surface of the first conductive layer exposed by the first trench, a capacitor structure including a first electrode pattern on the first conductive layer, a dielectric pattern on the first electrode pattern, and a second electrode pattern on the dielectric pattern, the first electrode pattern extending along sidewalls and a bottom surface of the first trench and an upper surface of the insulating structure, and a first wiring pattern on the capacitor structure.

According to an example embodiments of the present inventive concepts, a semiconductor device includes a first conductive layer on a substrate, an insulating structure on the first conductive layer, the insulating structure including a first trench and a second trench, the first trench exposing a first portion of an upper surface of the first conductive layer, the second trench exposing a second portion of the upper surface of the first conductive layer and spaced apart from the first trench, a capacitor structure extending along sidewalls and a bottom surface of the first trench, a first wiring pattern on the capacitor structure and extending along an upper surface of the insulating structure, and a second wiring pattern spaced apart from the first wiring pattern, filling the second trench, and extending along the upper surface of the insulating structure.

According to an example embodiments of the present inventive concepts, a semiconductor device includes, an insulating structure defining a first trench, on a substrate, a first conductive layer in the insulating structure, a first portion of an upper surface of the first conductive layer exposed by the first trench, a first electrode pattern extending along sidewalls and a bottom surface of the first trench, a dielectric pattern covering an upper surface and sidewalls of the first electrode pattern, a second electrode pattern extending along an upper surface of the dielectric pattern, and a first wiring pattern extending along an upper surface of the second electrode pattern.

According to an example embodiments of the present inventive concepts, a method for fabricating a semiconductor device includes forming an insulating structure defining a first trench and a first conductive layer in the insulating structure, the first trench exposing a first portion of an upper surface of the first conductive layer, forming a first electrode pattern extending along sidewalls and a bottom surface of the first trench and an upper surface of the insulating structure, sequentially forming a dielectric pattern and a second electrode pattern on the first electrode pattern to form a capacitor structure, and forming a first wiring pattern on the capacitor structure.

BRIEF DESCRIPTION OF THE DRAWINGS

The above and other aspects and features of the present inventive concepts will become more apparent by describing in detail exemplary embodiments thereof with reference to the attached drawings, in which:

FIG. 28 is an enlarged view of a part 'XXVII' of FIG. 27.

DETAILED DESCRIPTION

While the term "same" is used in description of example embodiments, it should be understood that some imprecisions may exist. Thus, when one element is referred to as being the same as another element, it should be understood that the one element is the same as another element within a desired manufacturing tolerance range (e.g., ±10%).

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure.

Hereinafter, a semiconductor device according to some example embodiments of the present inventive concepts will be described with reference to FIGS. 1 to 14.

Figure 1:
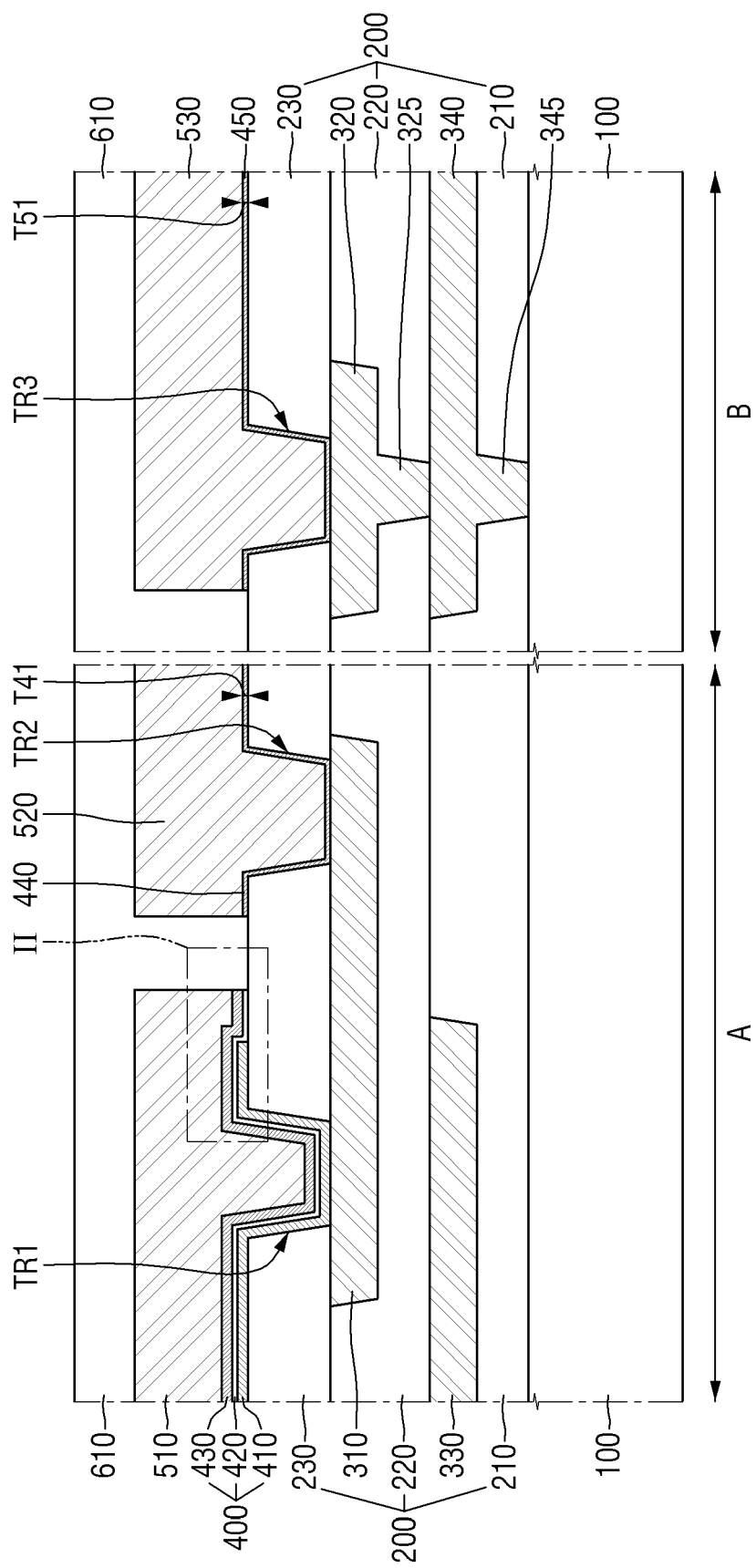
FIG. 1 is a schematic cross-sectional view for explaining the semiconductor device according to an example embodiment of the present inventive concepts.
Figure 2:
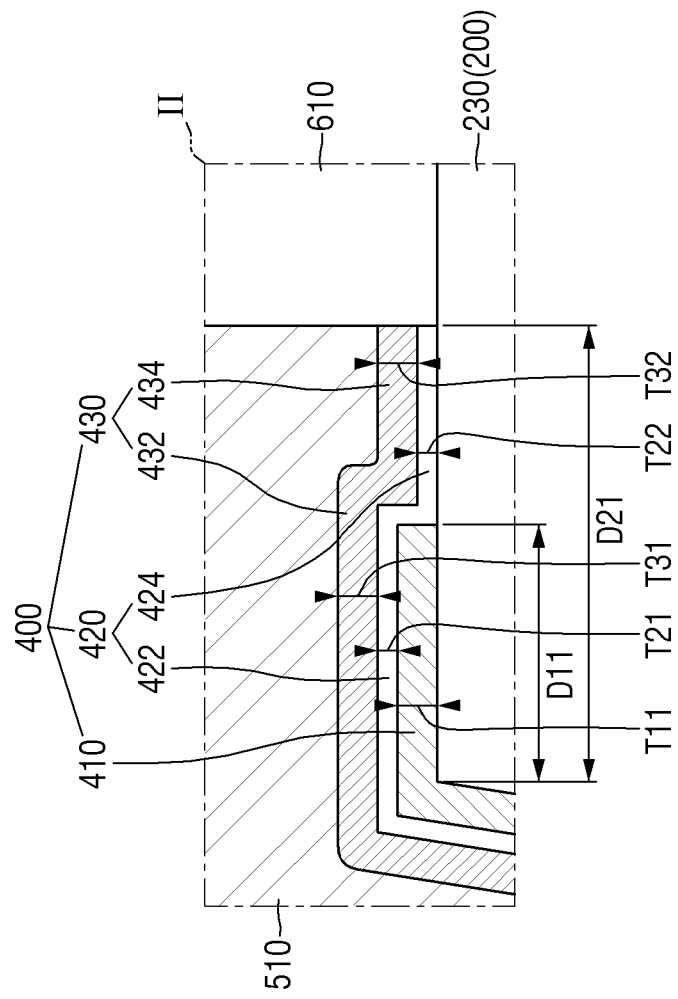
FIGS. 2 and 3 are various enlarged views illustrating a part 'II' of FIG. 1 according to an example embodiment.
Figure 3:
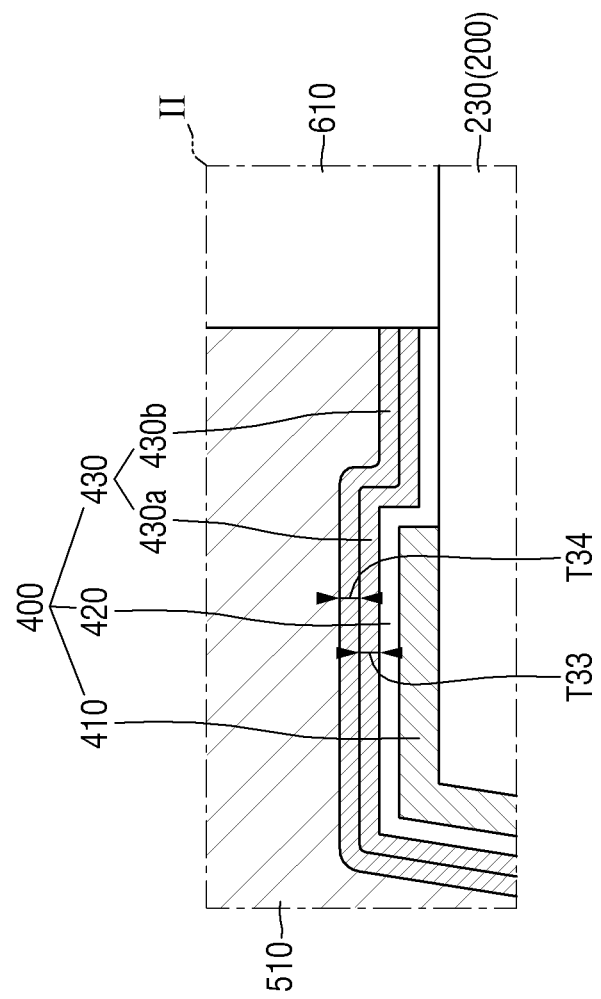

FIG. 1 is a schematic cross-sectional view for explaining the semiconductor device according to an example embodiment of the present inventive concepts. FIGS. 2 and 3 are various enlarged views illustrating a part 'II' of FIG. 1 according to some example embodiments.

Referring to FIGS. 1 to 3, the semiconductor device according to some example embodiments includes a substrate 100, an insulating structure 200, a plurality of conductive layers 310, 320, 330, 340, a capacitor structure 400, a first wiring pattern 510, a first barrier layer 440, a second wiring pattern 520, a second barrier layer 450 and a rewiring pattern 530.

The substrate 100 may be bulk silicon or silicon-on-insulating structure (SOI). In some example embodiments, the substrate 100 may be a silicon substrate or may include, but is not limited to, for example, other materials such as silicon germanium, silicon germanium on insulating structure (SGOI), indium antimonide, lead tellurium compound, indium arsenide, phosphide indium, gallium arsenide or gallium antimonide.

Although it is not illustrated, the substrate 100 may include various internal circuit patterns. The internal circuit pattern may include, for example, a transistor, a diode, and/or a capacitor.

The substrate 100 may include a first region A and a second region B. The first region A and the second region B may be separated from each other, and may be adjacent to each other. The first region A and the second region B may perform the same function, and may perform functions different from each other. Each of the first region A and the second region B may be, for example, one of a cell region or a circuit region. For example, memory cells may be formed in the cell region, and a peripheral circuit for driving the memory cells may be formed in the circuit region.

The insulating structure 200 may be formed on the substrate 100. The insulating structure 200 may include a plurality of insulating layers 210, 220, 230. For example, the insulating structure 200 may include first to third insulating layers 210, 220, 230 sequentially stacked on the substrate 100. Although the insulating structure 200 is illustrated as including only three insulating layers 210, 220, 230, it is only for convenience of explanation, and the present disclosure is not limited thereto.

Boundaries are illustrated as being formed between the first to third insulating layers 210, 220, 230, but this is only for convenience of explanation, and the present disclosure is not limited thereto. For example, the boundaries between the first to third insulation layers 210, 220, 230 may not be formed, depending on the process of forming the insulating structure 200.

The insulating structure 200 may include, for example, at least one of silicon oxide, silicon nitride, silicon oxynitride and/or a low dielectric constant (low-k) material having a dielectric constant lower than silicon oxide. The low dielectric constant material may include, but is not limited to, for example, one of FOX (Flowable Oxide), TOSZ (Torene SilaZene), USG (Undoped Silica Glass), BSG (Borosilica Glass), PSG (PhosphoSilica Glass), BPSG (Boro Phospho Silica Glass), PETEOS (Plasma Enhanced Tetra Ethyl Ortho Silicate), FSG (Fluoride Silicate Glass), CDO (Carbon Doped Silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, or combinations thereof.

The plurality of conductive layers 310, 320, 330, 340 may be formed in the insulating structure 200. For example, the first conductive layer 310 may be formed in the second insulating layer 220 on the first region I, and the second conductive layer 320 may be formed in the second region B on the first insulating layer 220. Also, for example, the third conductive layer 330 may be formed in the first insulating layer 210 on the first region I, and the fourth conductive layer 340 may be formed in the first insulating layer 210 on the second region II.

The conductive layers 310, 320, 330, 340 may be connected to each other or may be connected to the substrate 100 through vias 325, 345. For example, the second conductive layer 320 may be connected to the fourth conductive layer 340 through the first via 325 penetrating the second insulating layer 220. Further, for example, the fourth conductive layer 340 may be connected to the substrate 100 through the second via 345 penetrating the first insulating layer 210. Therefore, the conductive layers 310, 320, 330, 340 may be connected to various internal circuit patterns in the substrate 100.

The sidewalls of the conductive layers 310, 320, 330, 340, and the vias 325, 345 may each have a tapered shape (or, may be inclined). For example, the conductive layers 310, 320, 330, 340, and the vias 325, 345 may increase in width as they are away from the upper surface of the substrate 100, respectively. Here, the width means a width in a direction parallel to the upper surface of the substrate 100. The tapered shape may be attributed to the characteristics of the etching process for forming the conductive layers 310, 320, 330, 340 and the vias 325, 345. However, the present disclosure is not limited thereto, and the sidewalls of the conductive layer 310, 320, 330, 340 and the vias 325, 345 may have various shapes.

The conductive layers 310, 320, 330, 340 and the vias 325 may include, but is not limited to, for example, metal (e.g., tungsten (W), titanium (Ti), tantalum (Ta), copper (Cu) and aluminum (Al)), and/or metal nitride (e.g., titanium nitride, tantalum nitride and tungsten nitride).

The capacitor structure 400 may be formed on the insulating structure 200 and the first conductive layer 310. The insulating structure 200 may include a first trench TR1 which exposes a part of the upper surface of the first conductive layer 310. The first trench TR1 may be formed, for example, in a third insulating layer 230 on the first conductive layer 310. The capacitor structure 400 may extend along the sidewalls and the bottom surface of the first trench TR1 and the upper surface of the insulating structure 200. Thus, the capacitor structure 400 connected to the first conductive layer 310 may be formed on the insulating structure 200.

The capacitor structure 400 may include a first electrode pattern 410, a dielectric pattern 420 and a second electrode pattern 430 sequentially stacked on the insulating structure 200 and the first conductive layer 310. The first electrode pattern 410 may extend along the sidewall and the bottom surface of the first trench TR1 and the upper surface of the insulating structure 200. The first electrode pattern 410 may be electrically connected to the first conductive layer 310. The dielectric pattern 420 may extend along the profile of the upper surface of the first electrode pattern 410. The second electrode pattern 430 may extend along the profile of the upper surface of the dielectric pattern 420.

In FIG. 2, a thickness T11 of the first electrode pattern 410 is illustrated as being thicker than thicknesses T21 and T22 of the dielectric pattern 420, and thicknesses T31 and T32 of the second electrode pattern 430 are illustrated as being the same as the thickness T11 of the first electrode pattern 410. However, this is only for convenience of explanation, and the present disclosure is not limited thereto. For example, the thicknesses T21 and T22 of the dielectric pattern 420 may be thicker than the thickness T11 of the first electrode pattern 410 and the thicknesses T31 and T32 of the second electrode pattern 430. Also, for example, the thickness T11 of the first electrode pattern 410 may be different from the thicknesses T31 and T32 of the second electrode pattern 430.

In some example embodiments, the dielectric pattern 420 may extend to be longer than the first electrode pattern 410. For example, a first distance D11 from one edge of the first trench TR1 to one distal end of the first electrode pattern 410 may be shorter than a second distance D21 from the same edge of the first trench TR1 to one distal end of the dielectric pattern 420.

Thus, the dielectric pattern 420 may cover the upper surface and the sidewalls of the first electrode pattern 410. For example, as illustrated in FIG. 2, the dielectric pattern 420 may include a first extension 422 extending along the upper surface of the first electrode pattern 410, and a first protrusion 424 that protrudes from the first extension 422 and covers the sidewalls of the first electrode pattern 410. The first extension 422 of the dielectric pattern 420 may overlap the first electrode pattern 410, and the first protrusion 424 of the dielectric pattern 420 may not overlap the first electrode pattern 410. Here, the overlap means overlapping in a direction perpendicular to the upper surface of the substrate 100. In some example embodiments, the first protrusion 424 of the dielectric pattern 420 may be in direct contact with the upper surface of the insulating structure 200. In some example embodiments, the thickness T21 of the first extension 422 may be substantially the same as the thickness T22 of the first protrusion 424.

In some example embodiments, the second electrode pattern 430 may extend to be longer than the first electrode pattern 410. For example, the distance D11 from one end of the first trench TR1 to one distal end of the second electrode pattern 430 may be substantially the same as the second distance D21.

The second electrode pattern 430 may cover the upper surface of the dielectric pattern 420. For example, the second electrode pattern 430 may include a second extension 432 extending along the upper surface of the first extension 422, and a second protrusion 434 protruding from the second extension 432 and extending along the upper surface of the first protrusion 424. In some example embodiments, the thickness T31 of the second extension 432 may be the same as of substantially similar to the thickness T32 of the second protrusion 434.

For example, the first electrode pattern 410 and the second electrode pattern 430 may include, for example, at least one of titanium (Ti), titanium nitride (TiN), tantalum (Ta), tantalum nitride (TaN), tungsten nitride (WN), metal silicide, or combinations thereof. The first electrode pattern 410 and the second electrode pattern 430 may include the same material or different materials. In the following description, it is described that both the first electrode pattern 410 and the second electrode pattern 430 include titanium nitride (TiN).

The dielectric pattern 420 may include, for example, silicon oxide, silicon nitride, silicon oxynitride, or a high dielectric constant (high-k) material having a dielectric constant higher than silicon oxide. The high dielectric constant material may include, but is not limited to, for example, hafnium oxide, hafnium silicon oxide, hafnium aluminum oxide, lanthanum oxide, lanthanum aluminum, oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or combinations thereof.

The first wiring pattern 510 may be formed on the capacitor structure 400. The first wiring pattern 510 may extend along the upper surface of the insulating structure 200. For example, the first wiring pattern 510 may extend along the upper surface of the capacitor structure 400. The first wiring pattern 510 may be electrically connected to the second electrode pattern 430 of the capacitor structure 400.

In some example embodiments, the first wiring pattern 510 may completely fill the first trench TR1. Also, in some example embodiments, the sidewalls of the first wiring pattern 510 may be disposed on the same or substantially similar plane as the sidewalls of the dielectric pattern 420 and the sidewalls of the second electrode pattern 430.

The first wiring pattern 510 may include a conductive material. For example, the first wiring pattern 510 may include, but is not limited to, metal (e.g., tungsten (W), titanium (Ti), tantalum (Ta), copper (Cu), aluminum (Al) and nickel (Ni)). In the following description, it is described that the first wiring pattern 510 includes aluminum (Al).

The first barrier layer 440 may be formed on the insulating structure 200 and the first conductive layer 310. The first barrier layer 440 may be physically spaced apart from the capacitor structure 400.

The insulating structure 200 may include a second trench TR2, which is spaced apart from the first trench TR1 and exposes another part of the upper surface of the first conductive layer 310. The second trench TR2 may be formed, for example, in the third insulating layer 230 on the first conductive layer 310. The first barrier layer 440 may extend along sidewalls and the bottom surface of the second trench TR2. Therefore, the first barrier layer 440 connected to the first conductive layer 310 may be formed on the insulating structure 200. In some example embodiments, the first barrier layer 440 may further extend along the upper surface of the insulating structure 200.

The second wiring pattern 520 may be formed on the first barrier layer 440. The second wiring pattern 520 may be spaced apart from the first wiring pattern 510 and extend along the upper surface of the insulating structure 200. For example, the second wiring pattern 520 may extend along the upper surface of the first barrier layer 440. The second wiring pattern 520 may be electrically connected to the first conductive layer 310 and the first electrode pattern 410.

In some embodiments, the second wiring pattern 520 may completely fill the second trench TR2. Also, in some embodiments, the sidewalls of the second wiring pattern 520 may be disposed on the same or substantially similar plane as the sidewalls of the first barrier layer 440.

Voltages of different levels may be applied to the first wiring pattern 510 and the second wiring pattern 520. Thus, voltages of different levels may be applied to the first electrode pattern 410 and the second electrode pattern 430. The capacitor structure 400 may store electric charge in the dielectric pattern 420 by utilizing a potential difference generated between the first electrode pattern 410 and the second electrode pattern 430.

The second wiring pattern 520 may include a conductive material. For example, the second wiring pattern 520 may include, but is not limited to, a metal such as tungsten (W), titanium (Ti), tantalum (Ta), copper (Cu), aluminum (Al) and nickel (Ni).

In some embodiments, the second wiring pattern 520 may be formed at the same level as the first wiring pattern 510. In the present specification, "the same level" means the level formed by the same fabricating process. For example, the second wiring pattern 520 and the first wiring pattern 510 may include the same material. For example, the second wiring pattern 520 may include aluminum (Al).

The first barrier layer 440 may prevent the material (e.g., aluminum (Al)) included in the second wiring pattern 520 from diffusing to, for example, the insulating structure 200. The first barrier layer 440 may include, for example, at least one of titanium (Ti), titanium nitride (TiN), tantalum (Ta), tantalum nitride (TaN), tungsten nitride (WN), metal silicide, or combinations thereof.

In some example embodiments, the first barrier layer 440 and the second electrode pattern 430 may include a same material. In this specification, "the same" means not only completely the same thing but also a fine difference which may occur due to a process margin or the like. For example, the first barrier layer 440 may include titanium nitride (TiN).

In some example embodiments, the thicknesses T31 and T32 of the second electrode pattern 430 may be greater than the thickness T41 of the first barrier layer 440. This will be described later in the description of FIGS. 21 to 24.

The second barrier layer 450 may be formed on the insulating structure 200 and the second conductive layer 320. The second barrier layer 450 may be physically spaced apart from the capacitor structure 400 and the first barrier layer 440.

The insulating structure 200 may include a third trench TR3 which exposes a part of the upper surface of the second conductive layer 320. The third trench TR3 may be formed, for example, in the third insulating layer 230 on the second conductive layer 320. The second barrier layer 450 may extend along sidewalls and the bottom surface of the third trench TR3. Thus, the second barrier layer 450 connected to the second conductive layer 320 may be formed on the insulating structure 200. In some example embodiments, the second barrier layer 450 may further extend along the upper surface of the insulating structure 200.

Each of the sidewalls of the first to third trenches TR1, TR2, TR3 may have a tapered shape. For example, the first to third trenches TR1, TR2, TR3 may increase in width as they are away from the upper surface of the substrate 100. Here, the width means a width in a direction parallel to the upper surface of the substrate 100. This may be attributed to the characteristics of the etching process for forming the first to third trenches TR1, TR2, TR3. However, the present disclosure is not limited thereto, and the sidewalls of the first to third trenches TR1, TR2, TR3 may have various shapes.

The rewiring pattern 530 may be formed on the second barrier layer 450. The rewiring pattern 530 may extend along the upper surface of the insulating structure 200. For example, the rewiring pattern 530 may extend along the upper surface of the second barrier layer 450. The rewiring pattern 530 may be electrically connected to the second conductive layer 320.

In some example embodiments, the rewiring pattern 530 may completely fill the third trench TR3. Also, in some example embodiments, the sidewalls of the rewiring pattern 530 may be disposed on the same plane as the sidewalls of the second barrier layer 450.

The rewiring pattern 530 may include a conductive material. For example, the rewiring pattern 530 may include, but is not limited to, metals such as tungsten (W), titanium (Ti), tantalum (Ta), copper (Cu), aluminum (Al), and nickel (Ni).

In some embodiments, the rewiring pattern 530 may be formed at the same level as the first wiring pattern 510 and the second wiring pattern 520. For example, the first wiring pattern 510, the second wiring pattern 520, and the rewiring pattern 530 may include a same material. For example, the rewiring pattern 530 may include aluminum (Al).

The second barrier layer 450 may mitigate or prevent the material (e.g., aluminum (Al)) included in the rewiring pattern 530 from diffusing into, for example, the insulating structure 200. The second barrier layer 450 may include, for example, at least one of titanium (Ti), titanium nitride (TiN), tantalum (Ta), tantalum nitride (TaN), tungsten nitride (WN), metal silicide, or combinations thereof.

In some example embodiments, the second barrier layer 450 may be formed at the same level as the first barrier layer 440. For example, the second barrier layer 450 and the first barrier layer 440 may include the same material. For example, the second barrier layer 450 may include titanium nitride (TiN).

In some example embodiments, the thickness T31, T32 of the second electrode pattern 430 may be thicker than the thickness T51 of the second barrier layer 450. Also, in some example embodiments, the thickness T51 of the second barrier layer 450 may be the same as or substantially similar to the thickness T41 of the first barrier layer 440. This will be described later in the description of FIGS. 21 to 24.

In some example embodiments, as illustrated in FIG. 3, the second electrode pattern 430 may include a lower electrode pattern 430a and an upper electrode pattern 430b sequentially stacked on the dielectric pattern 420. The lower electrode pattern 430a may extend along the profile of the upper surface of the dielectric pattern 420. The upper electrode pattern 430b may extend along the profile of the upper surface of the lower electrode pattern 430a. The lower electrode pattern 430a and the upper electrode pattern 430b may include the same material or different materials.

In FIG. 3, the thickness T33 of the lower electrode pattern 430a is illustrated to be the same as the thickness T34 of the upper electrode pattern 430b. However, this is only for convenience of explanation, and the present disclosure is not limited thereto.

In some example embodiments, the upper electrode pattern 430b may be formed at the same level as the first barrier layer 440 and the second barrier layer 450. For example, the upper electrode pattern 430b, the first barrier layer 440, and the second barrier layer 450 may include the same material.

In some example embodiments, the thickness T34 of the upper electrode pattern 430b may be the same as or substantially similar to the thickness T41 of the first barrier layer 440 and the thickness T51 of the second barrier layer 450. This will be described later in the description of FIGS. 21 to 24.

In some example embodiments, a passivation layer 610 may be further formed on the insulating structure 200.

The passivation layer 610 may be formed to cover the first wiring pattern 510, the second wiring pattern 520 and the rewiring pattern 530. The passivation layer 610 may protect the first wiring pattern 510, the second wiring pattern 520 and the rewiring pattern 530. Although not specifically illustrated, the passivation layer 610 may expose some of the first wiring pattern 510, the second wiring pattern 520 and the rewiring pattern 530 so that the first wiring pattern 510, the second wiring pattern 520 and the rewiring pattern 530 are connected to another wiring pattern.

The passivation layer 610 may include, but is not limited to, for example, a polymer such as photosensitive polyimide (PSPI), bezn-cyclo-butene (BCB), or epoxy.

Because at least a part of the capacitor structure 400 extends along the sidewalls and the bottom surface of the first trench TR1, an area in which the capacitor is formed in a limited space may increase. For example, the capacitor structure 400 may have an area greater than a capacitor structure extending only along the upper surface of the insulating structure 200. Thus, a semiconductor device including a capacitor with improved capacitance in a limited space can be provided.

Further, in the capacitor structure 400, the dielectric pattern 420 may extend to be longer than the first electrode pattern 410 to cover the upper surface and the sidewalls of the first electrode pattern 410. Thus, a short circuit between the sidewalls of the first electrode pattern 410 and the second electrode pattern 430 may be mitigated or prevented. Thus, a semiconductor device including a capacitor with improved reliability can be provided.

Figure 4:
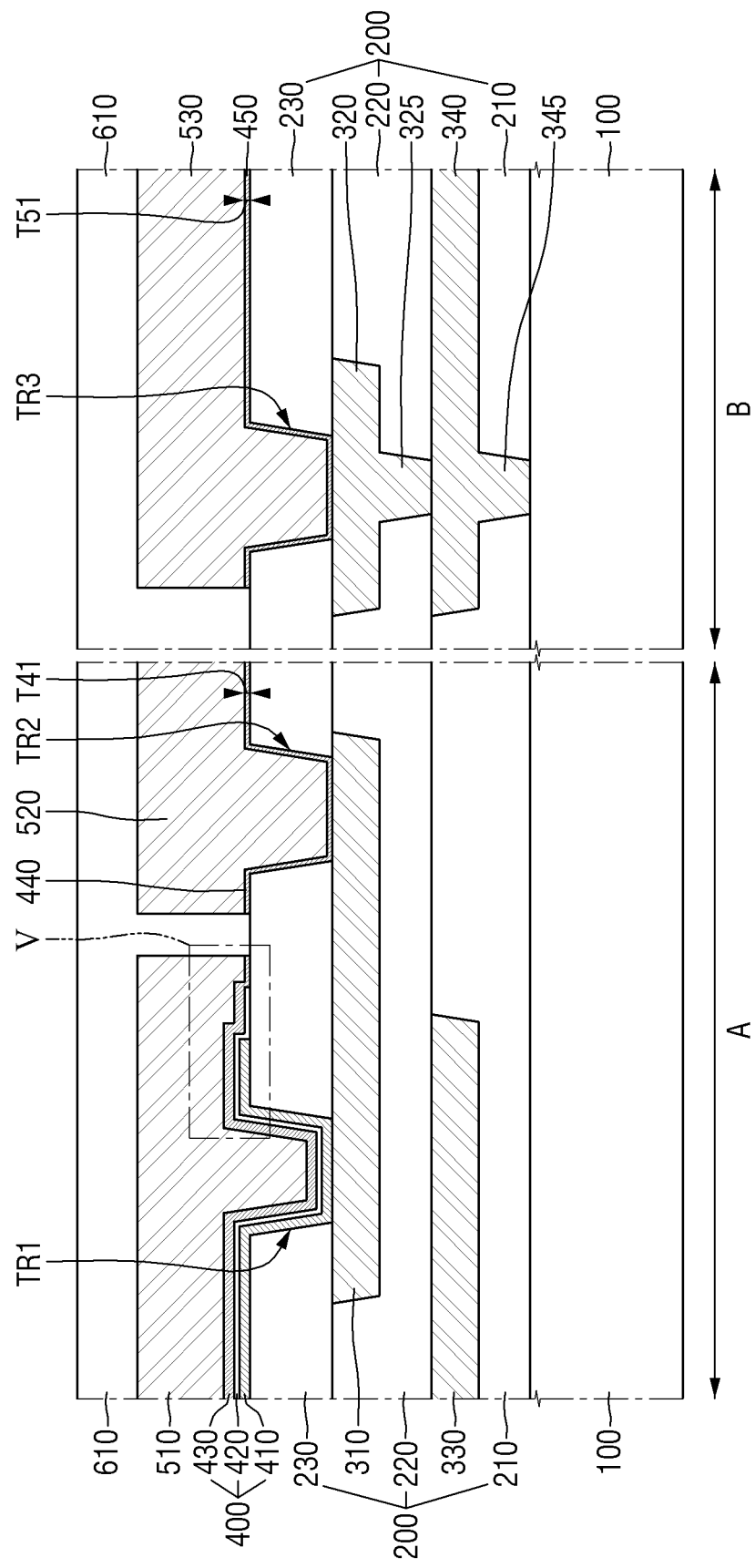
FIG. 4 is a schematic cross-sectional view for explaining a semiconductor device according to an example embodiment of the present inventive concepts.
Figure 5:
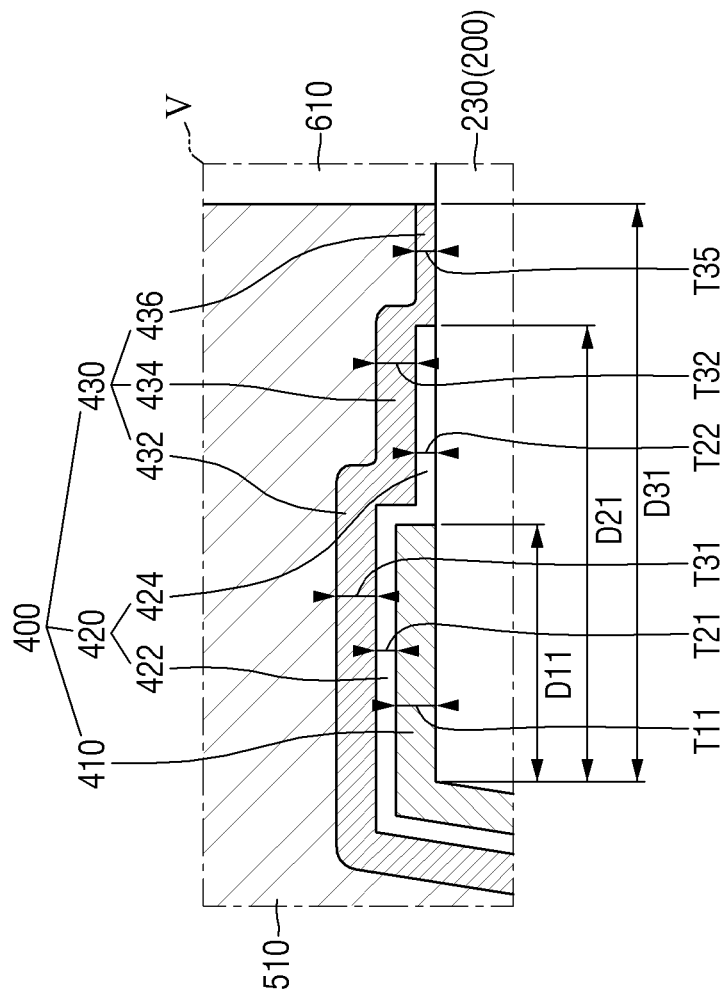
FIGS. 5 and 6 are various enlarged views of a part 'V' of FIG. 4.
Figure 6:
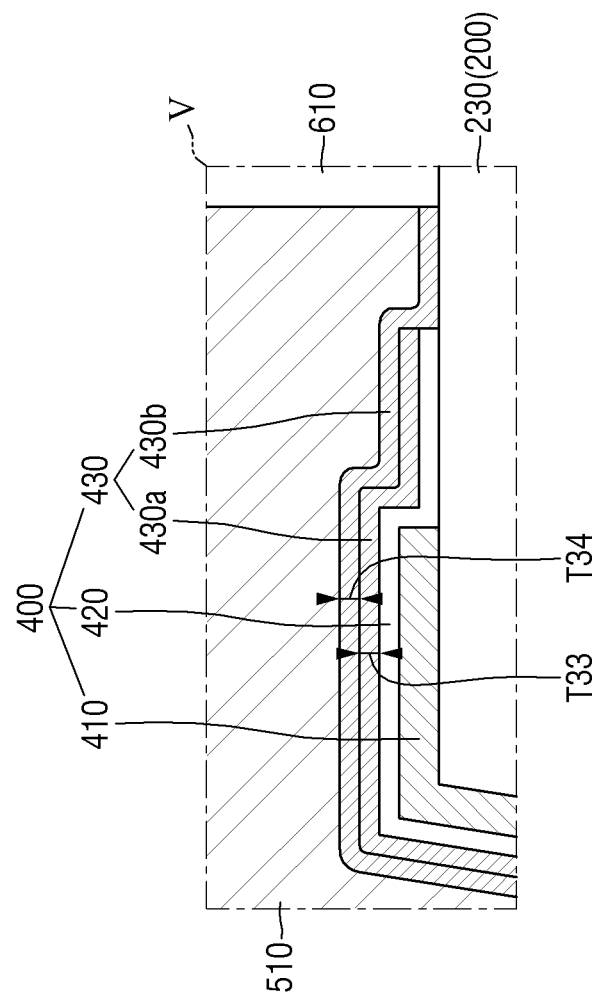

FIG. 4 is a schematic cross-sectional view for explaining the semiconductor device according to an example embodiment of the present inventive concepts. FIGS. 5 and 6 are various enlarged views of a part 'V' of FIG. 4. For the sake of convenience of explanation, repeated parts of description provided in connection with FIGS. 1 to 3 will be briefly described or omitted.

Referring to FIGS. 4 through 6, the second electrode pattern 430 extends to be longer than the dielectric pattern 420.

For example, the second distance D21 from the first trench TR1 to one distal end of the dielectric pattern 420 may be shorter than the third distance D31 from the first trench TR1 to one distal end of the second electrode pattern 430.

Accordingly, the second electrode pattern 430 may cover the upper surface and the sidewalls of the dielectric pattern 420. For example, as illustrated in FIG. 5, the second electrode pattern 430 may include a third protrusion 436 that protrudes from the second protrusion 434 to cover the sidewalls of the dielectric pattern 420. The second extension 432 and the second protrusion 434 of the second electrode pattern 430 may overlap the dielectric pattern 420, and the third protrusion 436 of the second electrode pattern 430 may not overlap the dielectric pattern 420. In some example embodiments, the third protrusion 436 of the second electrode pattern 430 may be in direct contact with the upper surface of the insulating structure 200.

In some example embodiments, the thickness T31 of the second extension 432 and the thickness T32 of the second protrusion 434 may be thicker than the thickness T35 of the third protrusion 436. This will be described later in the description of FIGS. 21 through 24.

In some example embodiments, the sidewalls of the first wiring pattern 510 may be disposed on the same or substantially similar plane as the sidewalls of the third protrusion 436.

In some example embodiments, as illustrated in FIG. 6, the second electrode pattern 430 may include a lower electrode pattern 430a and an upper electrode pattern 430b sequentially stacked on the dielectric pattern 420. The lower electrode pattern 430a may extend along the profile of the upper surface of the dielectric pattern 420. The upper electrode pattern 430b may extend along the profile of the upper surface of the lower electrode pattern 430a. Further, the upper electrode pattern 430b may cover the sidewalls of the dielectric pattern 420 and the sidewalls of the lower electrode pattern 430a. In some example embodiments, a portion of the upper electrode pattern 430b may be in direct contact with the upper surface of the insulating structure 200.

Figure 7:
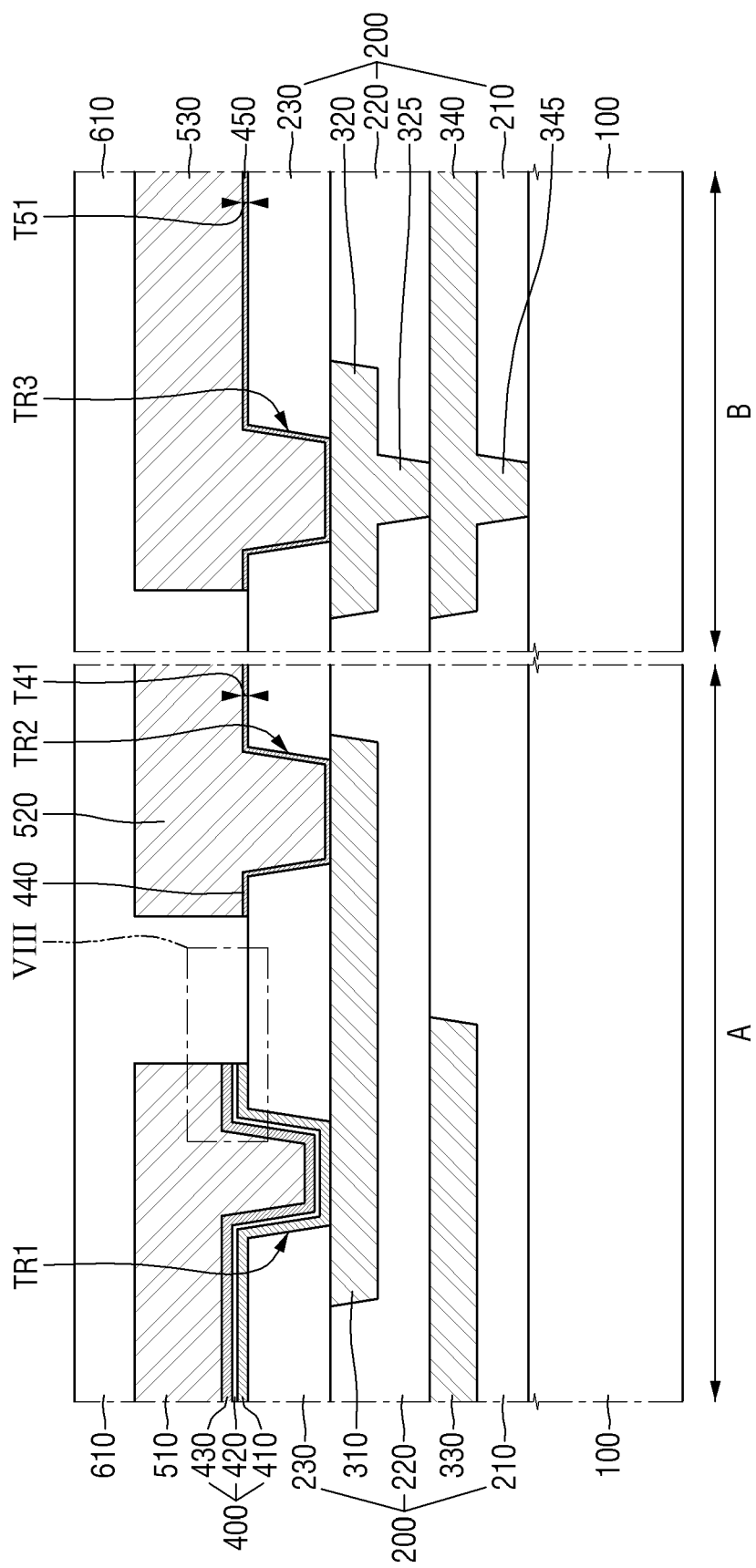
FIG. 7 is a schematic cross-sectional view illustrating a semiconductor device according to an example embodiment of the present inventive concepts.
Figure 8:
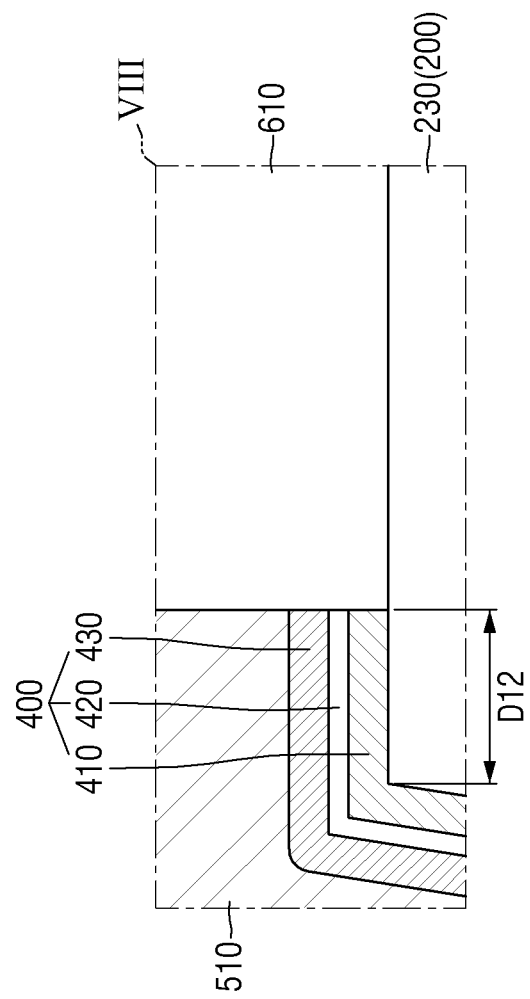
FIG. 8 is an enlarged view of a part 'VIII' of FIG. 7.

FIG. 7 is a schematic cross-sectional view illustrating a semiconductor device according to an example embodiment of the present inventive concepts. FIG. 8 is an enlarged view of a part 'VIII' of FIG. 7. For the sake of convenience of explanation, repeated parts of description provided in connection with FIGS. 1 to 3 will be briefly described or omitted.

Referring to FIGS. 7 and 8, the sidewalls of the first electrode pattern 410, the sidewalls of the dielectric pattern 420, and the sidewalls of the second electrode pattern 430 are disposed on the same plane.

For example, one distal end of the first electrode pattern 410 may be spaced apart from the first trench TR1 by the fourth distance D12. At this time, the distance from the first trench TR1 to one distal end of the dielectric pattern 420 may be the same as or substantially similar to the fourth distance D12. Also, the distance from the first trench TR1 to one distal end of the second electrode pattern 430 may be the same as or substantially similar to the fourth distance D12.

In some example embodiments, the sidewalls of the first wiring pattern 510 may be disposed on substantially the same plane as the sidewalls of the first electrode pattern 410, the sidewalls of the dielectric pattern 420, and the sidewalls of the second electrode pattern 430.

Figure 9:
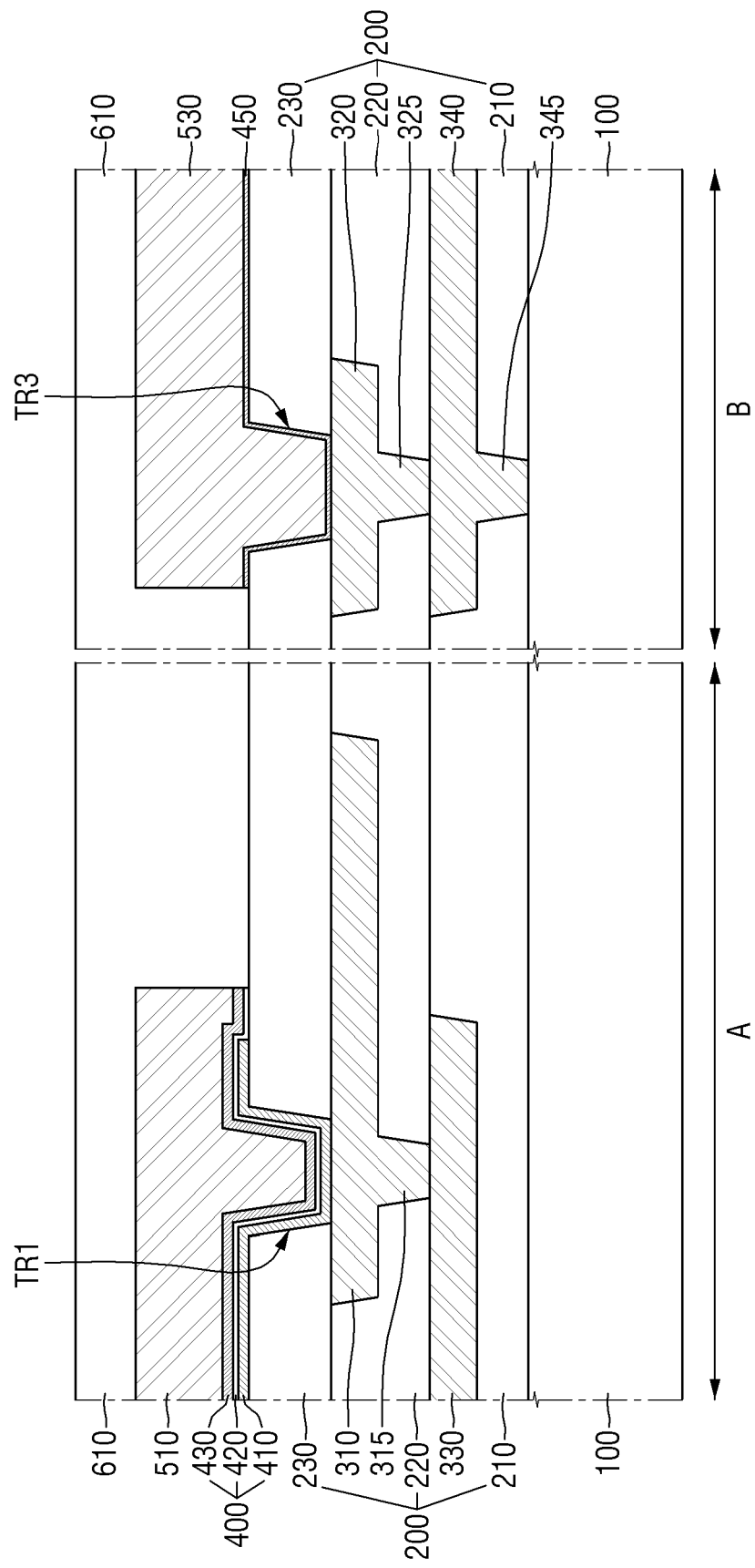
FIG. 9 is a schematic cross-sectional view for explaining a semiconductor device according to an example embodiment of the present inventive concepts.

FIG. 9 is a schematic cross-sectional view for explaining a semiconductor device according to an example embodiment of the present inventive concepts. For the sake of convenience of explanation, repeated parts of description provided in connection with FIGS. 1 to 3 will be briefly described or omitted.

Referring to FIG. 9, a voltage applied to the first electrode pattern 410 is not provided from the second wiring pattern 520 (see FIG. 1).

For example, voltages of different levels may be applied to the first wiring pattern 510 and the third conductive layer 330. The third conductive layer 330 may be electrically connected to the first conductive layer 310, for example, by a third via 315 penetrating the second insulating layer 220. Thus, voltages of different levels may be applied to the first electrode pattern 410 and the second electrode pattern 430.

In some example embodiments, the second barrier layer 450 and the second wiring pattern 520 may be omitted.

Figure 10:
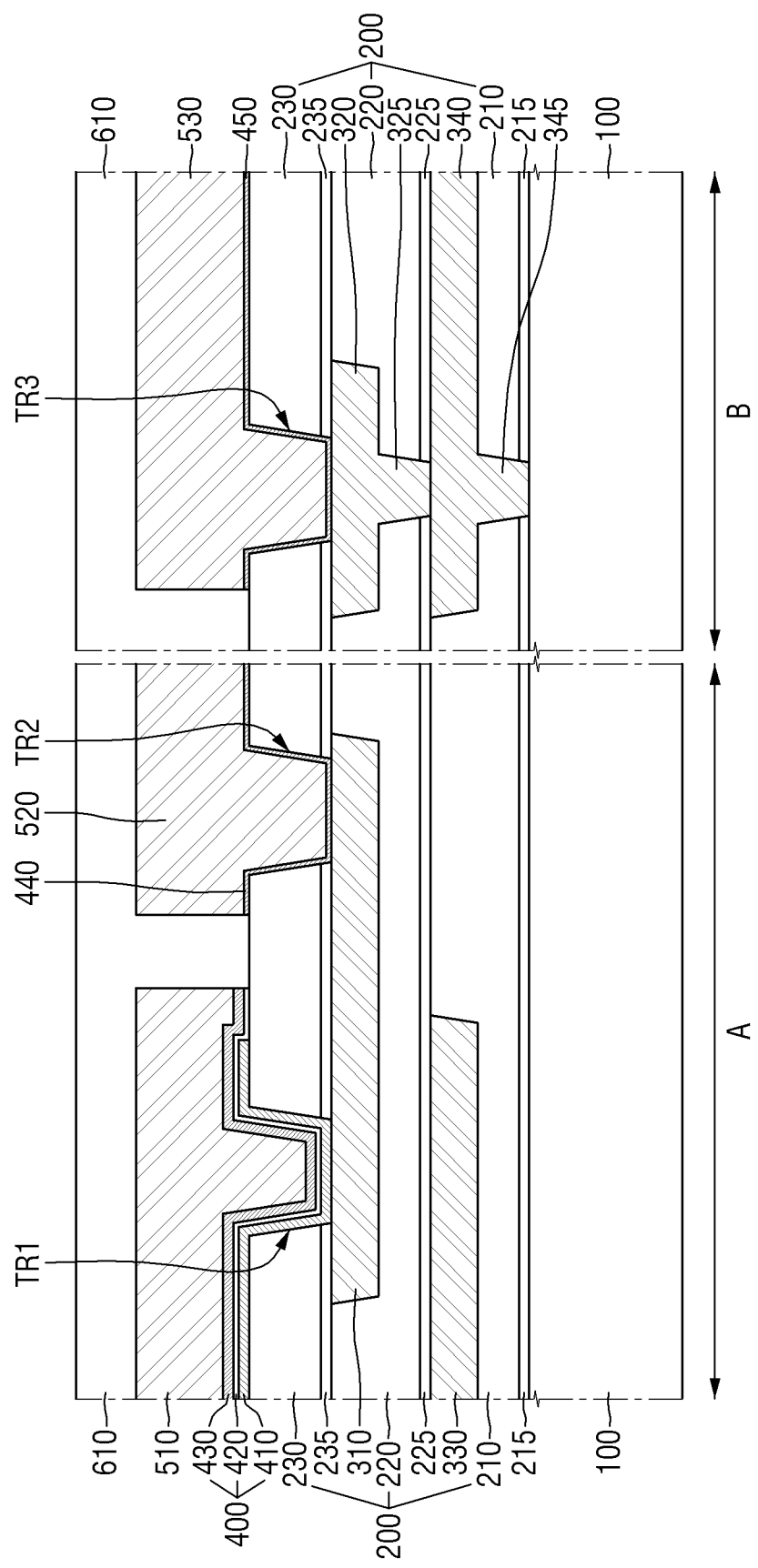
FIG. 10 is a schematic cross-sectional view for explaining a semiconductor device according to an example embodiment of the present inventive concepts.

FIG. 10 is a schematic cross-sectional view for explaining a semiconductor device according to an example embodiment of the present inventive concepts. For the sake of convenience of explanation, repeated parts of description provided in connection with FIGS. 1 to 3 will be briefly described or omitted.

Referring to FIG. 10, the insulating structure 200 includes a plurality of etching prevention films 215, 225, 235.

For example, the insulating structure 200 may include first to third etching prevention films 215, 225, 235. The first etching prevention film 215 may extend, for example, along the upper surface of the substrate 100. The second etching prevention film 225 may extend, for example, along the upper surface of the first insulating layer 210, the upper surface of the third conductive layer 330, and the upper surface of the fourth conductive layer 340. The third etching prevention film 235 may extend, for example, along the upper surface of the second insulating layer 220, the upper surface of the first conductive layer 310, and the upper surface of the second conductive layer 320.

In some example embodiments, the first to third trenches TR1, TR2, TR3 may penetrate the third etching prevention film 235 to expose a part of the upper surface of the first conductive layer 310 and a part of the upper surface of the second conductive layer 320. In some example embodiments, the first via 325 penetrates the second etching prevention film 225 and may be connected to the fourth conductive layer 340. In some example embodiments, the second via 345 penetrates the first etching prevention film 215 and may be connected to the substrate 100.

The first to third etching prevention films 215, 225, and 235 may include, but are not limited to, for example, silicon nitride (SiN).

Figure 11:
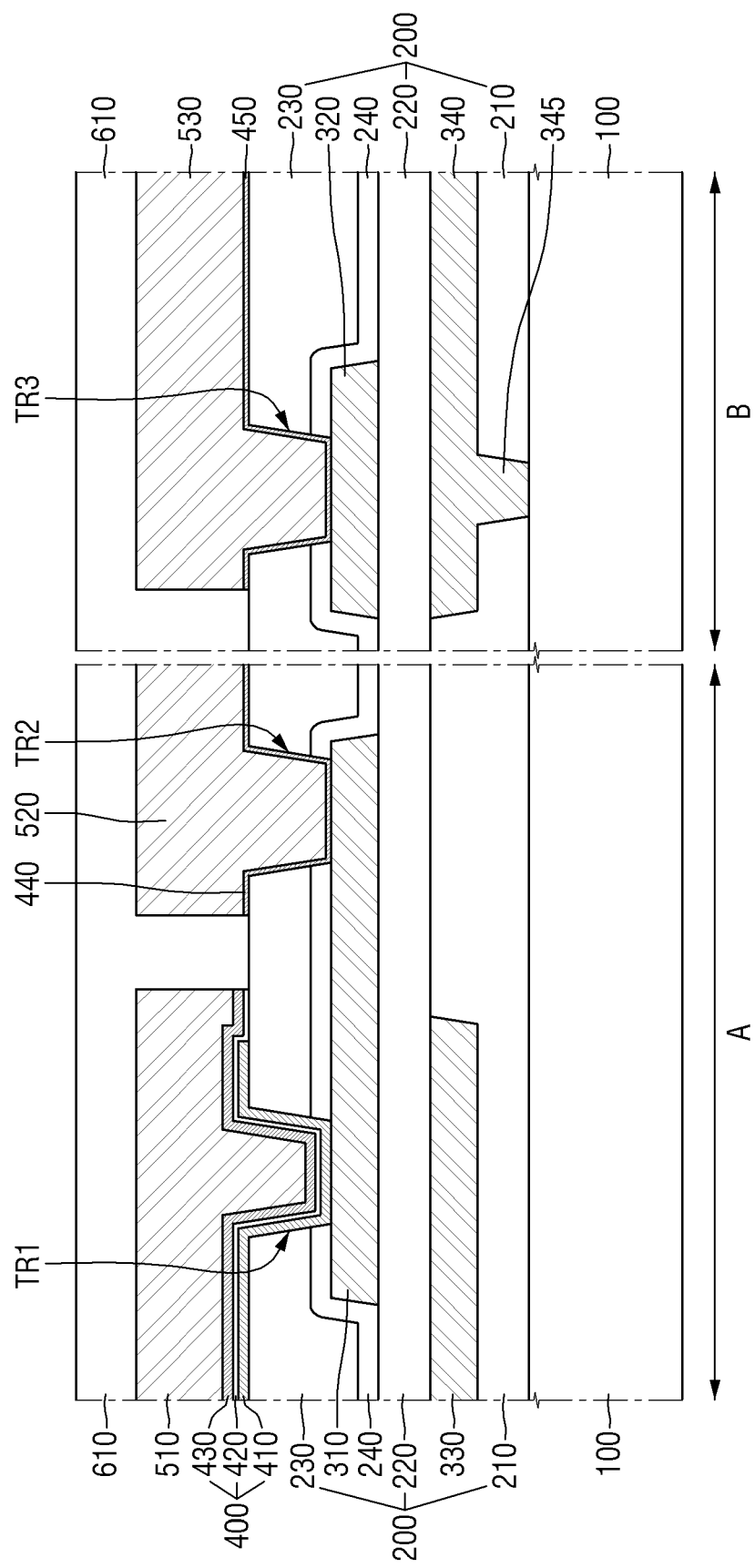
FIG. 11 is a schematic cross-sectional view for explaining a semiconductor device according to some example embodiments of the present inventive concepts.

FIG. 11 is a schematic cross-sectional view for explaining the semiconductor device according to an example embodiment of the present inventive concepts. For the sake of convenience of explanation, repeated parts of description provided in connection with FIGS. 1 to 3 will be briefly described or omitted.

Referring to FIG. 11, the first conductive layer 310 and the second conductive layer 320 may be conductive pads formed on the insulating structure 200.

The first conductive layer 310 and the second conductive layer 320 may be formed, for example, to extend along the upper surface of the second insulating layer 220.

The sidewalls of the first conductive layer 310 and the second conductive layer 320 may each have a tapered shape. For example, the first conductive layer 310 and the second conductive layer 320 may increase in width as they are away from the upper surface of the substrate 100. Here, the width means a width in a direction parallel to the upper surface of the substrate 100. The tapered shape may be attributed to the characteristics of the etching process for forming the first conductive layer 310 and the second conductive layer 320. However, the present disclosure is not limited thereto, and the sidewalls of the first conductive layer 310 and the second conductive layer 320 may have various shapes.

In some example embodiments, a fourth insulating layer 240 which exposes a part of the upper surface of the first conductive layer 310 and a part of the upper surface of the second conductive layer 320 may be further formed on the first conductive layer 310 and the second conductive layer 320. The fourth insulating layer 240 may extend along the profiles of the upper surface and the sidewalls of the first conductive layer 310, the upper surface and the sidewalls of the second conductive layer 320, and the upper surface of the second insulating layer 220.

The first to third trenches TR1, TR2, TR3 penetrate the fourth insulating layer 240, and may expose a part of the upper surface of the first conductive layer 310 and a part of the upper surface of the second conductive layer 320.

Figure 12:
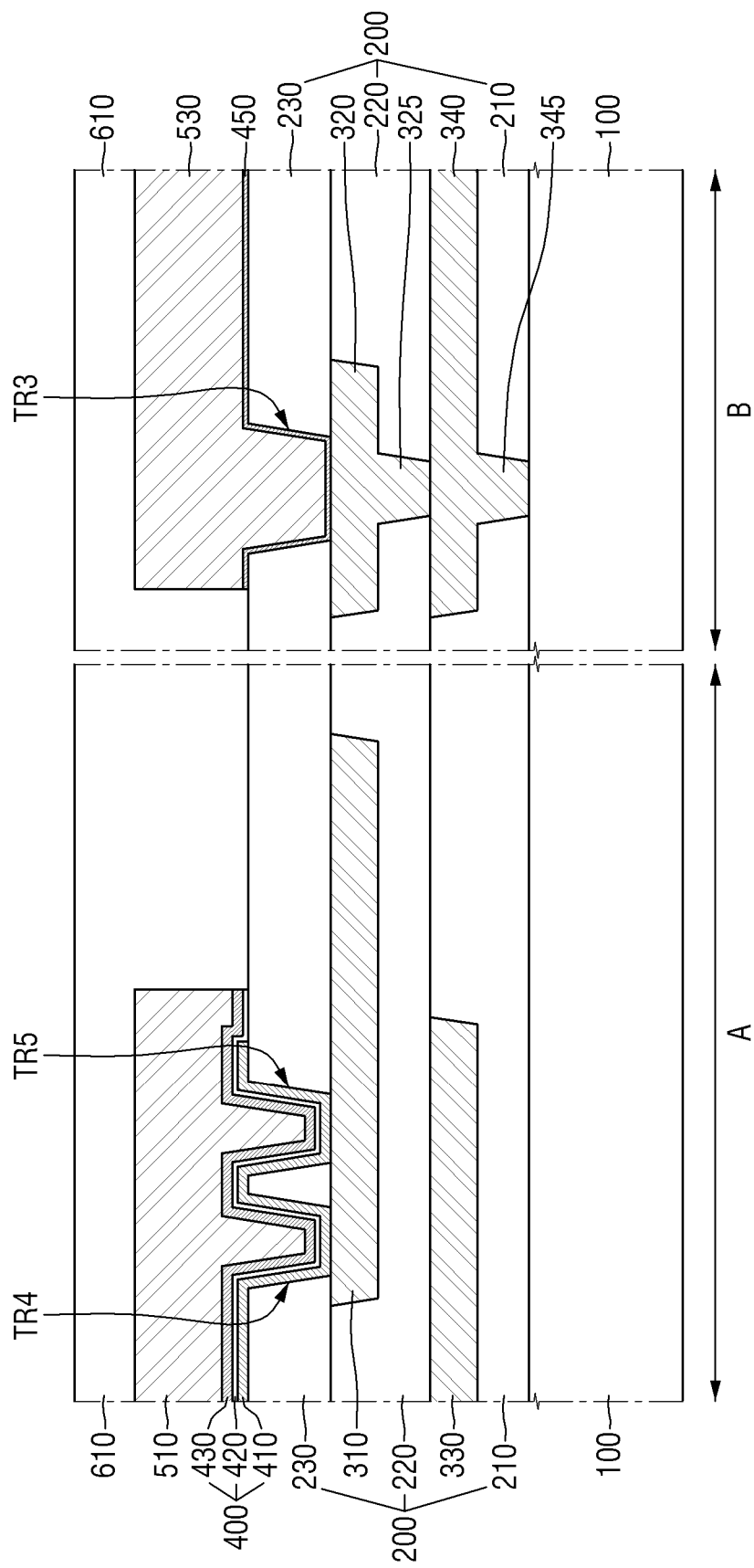
FIG. 12 is a schematic cross-sectional view for explaining a semiconductor device according to an example embodiment of the present inventive concepts.

FIG. 12 is a schematic cross-sectional view illustrating a semiconductor device according to an example embodiment of the present inventive concepts. For the sake of convenience of explanation, repeated parts of description provided in connection with FIGS. 1 to 3 will be briefly described or omitted.

Referring to FIG. 12, the capacitor structure 400 extends along the plurality of trenches TR4, TR5.

For example, the insulating structure 200 may include fourth and fifth trenches TR4, TR5. The fourth and fifth trenches TR4, TR5 may be formed, for example, in the third insulating layer 230 on the first conductive layer 310. The fourth and fifth trenches TR4, TR5 may be formed to be spaced apart from the third trench TR3.

The capacitor structure 400 may extend along the sidewalls and the bottom surface of the fourth and fifth trenches TR4, TR5 and the upper surface of the insulating structure 200. The capacitor structure 400 is illustrated as extending along only the two trenches TR4, TR5, but this is only for convenience of explanation, and the present disclosure is not limited thereto. For example, the capacitor structure 400 may extend along three or more trenches.

All the fourth and fifth trenches TR4, TR5 are illustrated as exposing the upper surface of the first conductive layer 310, but this is only for convenience of description, and the present inventive concepts are not limited thereto. At least one of the fourth or fifth trenches TR4, TR5 may expose a part of the upper surface of the first conductive layer 310. Thus, the capacitor structure 400 connected to the first conductive layer 310 may be formed on the insulating structure 200.

Figure 13:
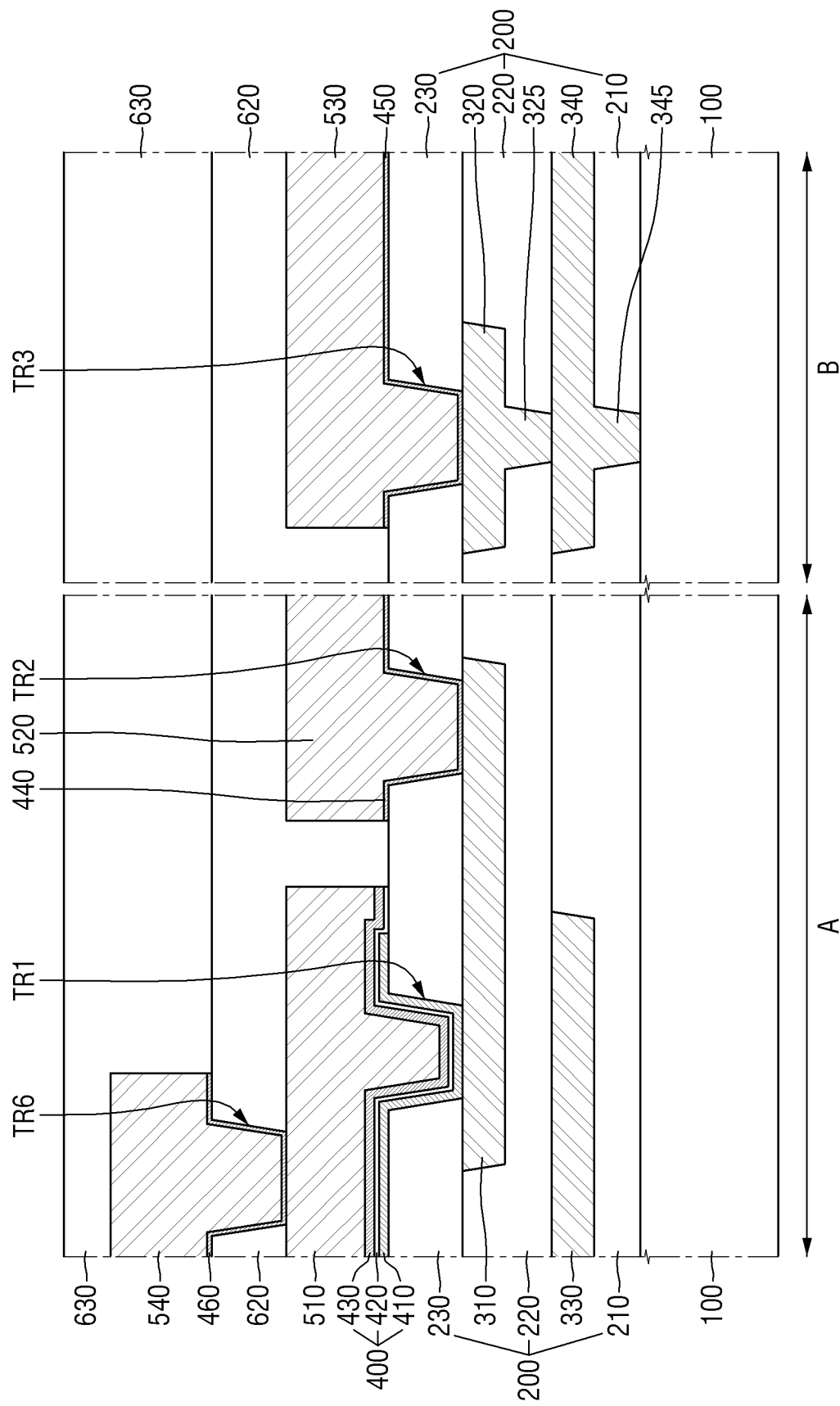
FIG. 13 is a schematic cross-sectional view for explaining a semiconductor device according to an example embodiment of the present inventive concepts.

FIG. 13 is a schematic cross-sectional view for explaining a semiconductor device according to an example embodiment of the present inventive concepts. For the sake of convenience of explanation, repeated parts of description provided in connection with FIGS. 1 to 3 will be briefly described or omitted.

Referring to FIG. 13, a fourth wiring pattern 540 on the first wiring pattern 510, the second wiring pattern 520, and the rewiring pattern 530 may be further formed.

For example, a fifth insulating layer 620, which covers the first wiring pattern 510, the second wiring pattern 520 and the rewiring pattern 530, may be formed. The fifth insulating layer 620 may include a sixth trench TR6 which exposes a part of the upper surface of the first wiring pattern 510. The fourth wiring pattern 540 may be formed in the sixth trench TR6 and may extend along the upper surface of the fifth insulating layer 620. The fourth wiring pattern 540 may be electrically connected to the first wiring pattern 510.

Only a single fourth wiring pattern 540 connected to the first wiring pattern 510 is illustrated on the first wiring pattern 510, but this is only for convenience of explanation, and the present disclosure is not limited thereto. In some example embodiments, additional wiring pattern 540, which is connected to the second wiring pattern 520 or the rewiring pattern 530 may be formed on the second wiring pattern 520 or the rewiring pattern 530.

The fourth wiring pattern 540 may include a conductive material. For example, the fourth wiring pattern 540 may include, but is not limited to, metal (e.g., tungsten (W), titanium (Ti), tantalum (Ta), copper (Cu), aluminum (Al), or nickel (Ni)). In some example embodiments, the fourth wiring pattern 540 may include the same conductive material as the first wiring pattern 510, the second wiring pattern 520, and the rewiring pattern 530.

In some example embodiments, a third barrier layer 460 extending along the sidewalls and the bottom surface of the sixth trench TR6 may be further formed. The fourth wiring pattern 540 may be formed on the third barrier layer 460.

The third barrier layer 460 may mitigate or prevent the material included in the fourth wiring pattern 540 from diffusing into, for example, the insulating structure 200. The third barrier layer 460 may include, for example, at least one of titanium (Ti), titanium nitride (TiN), tantalum (Ta), tantalum nitride (TaN), tungsten nitride (WN), metal silicide, or combinations thereof. In some example embodiments, the third barrier layer 460 may include the same material as the first barrier layer 440 and the second barrier layer 450.

In some example embodiments, a sixth insulating layer 630 which covers the fourth wiring pattern 540 may be further formed.

Figure 14:
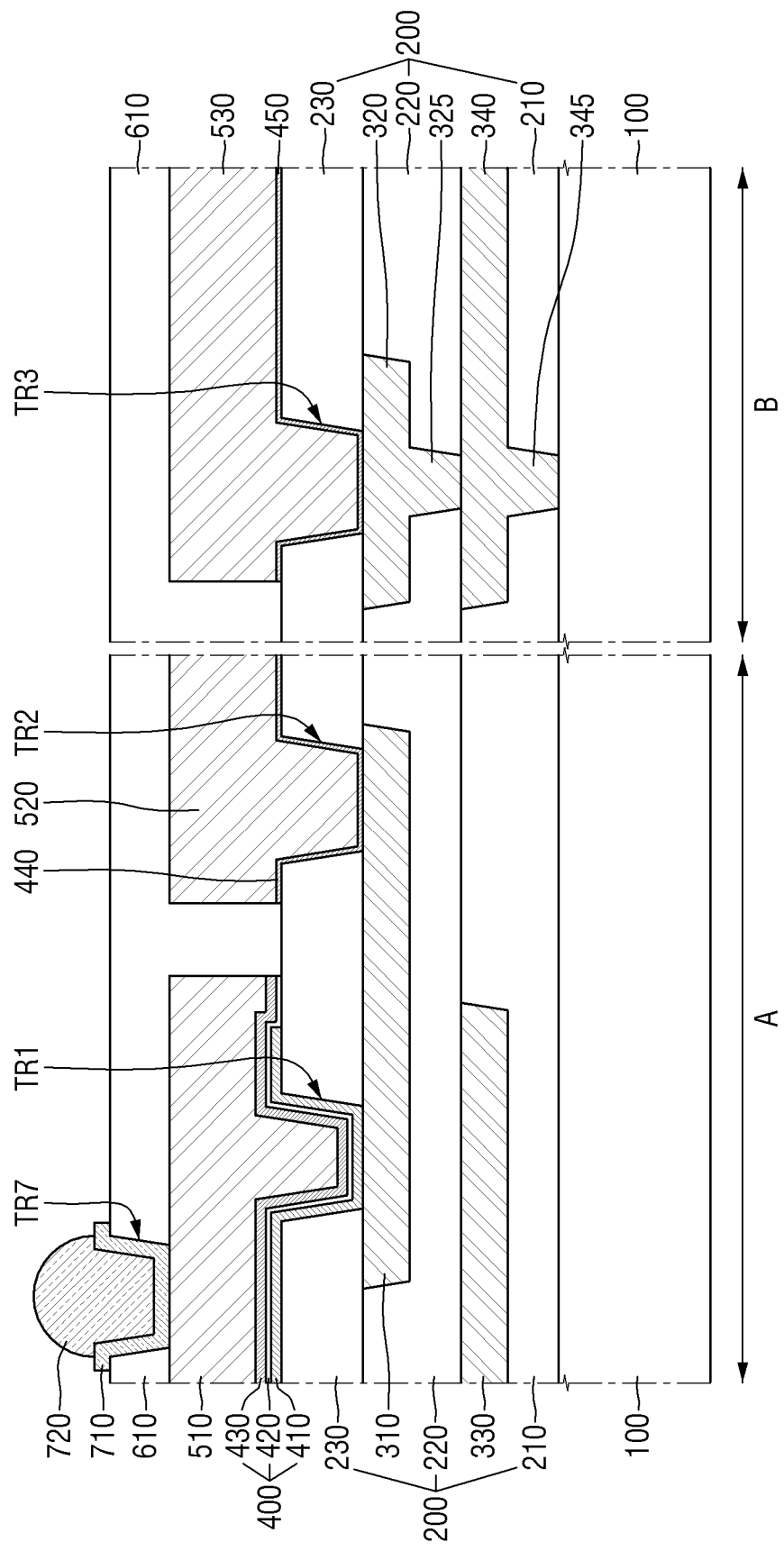
FIG. 14 is a schematic cross-sectional view for explaining a semiconductor device according to an example embodiment of the present inventive concepts.

FIG. 14 is a schematic cross-sectional view for explaining a semiconductor device according to an example embodiment of the present inventive concepts. For the sake of convenience of explanation, repeated parts of description provided in connection with FIGS. 1 to 3 will be briefly described or omitted.

Referring to FIG. 14, a solder bump 720 on the first wiring pattern 510, the second wiring pattern 520, and the rewiring pattern 530 may be further formed.

For example, the passivation layer 610 may include a seventh trench TR7, which exposes a part of the upper surface of the first wiring pattern 510. The solder bump 720 may be formed to fill the seventh trench TR7. The solder bump 720 may be electrically connected to the first wiring pattern 510.

Only one solder bump 720 connected to the first wiring pattern 510 is illustrated on the first wiring pattern 510, but this is only for convenience of explanation, and the present inventive concepts are not limited thereto. For example, another solder bump 720 connected to the second wiring pattern 520 or the rewiring pattern 530 may be formed on the second wiring pattern 520 or the rewiring pattern 530.

The solder bump 720 may be used, for example, as a conductive protrusion used for tab automated bonding (TAB) or flip chip bonding. In some example embodiments, the solder bump 720 may also be used as a conductive protrusion for connecting a ball grid array (BGA) and a chip scale package (CSP) to a package substrate or the like.

In some example embodiments, a metal film 710 extending along the sidewalls and the bottom surface of the seventh trench TR7 may be further formed. The solder bump 720 may be formed on the metal film 710. The metal film 710 may function as an adhesive layer, a diffusion preventing layer and/or a wetting layer. The metal film 710 may be, for example, under bump metallurgy (UBM).

For example, the metal film 710 may include, but is not limited to, for example, at least one of chromium (Cr), copper (Cu), nickel (Ni), titanium-tungsten (TiW), nickel-vanadium (NiV), or combinations thereof.

Hereinafter, a method for fabricating a semiconductor device according to an example embodiment of the present inventive concepts will be described with reference to FIGS. 1 to 8 and FIGS. 15 to 28.

FIGS. 15 to 24 are intermediate stage diagrams for explaining a method for fabricating a semiconductor device according to an example embodiment of the present inventive concepts. For the sake of convenience of explanation, repeated parts of description provided in connection with FIGS. 1 to 14 will be briefly explained or omitted.

Figure 15:
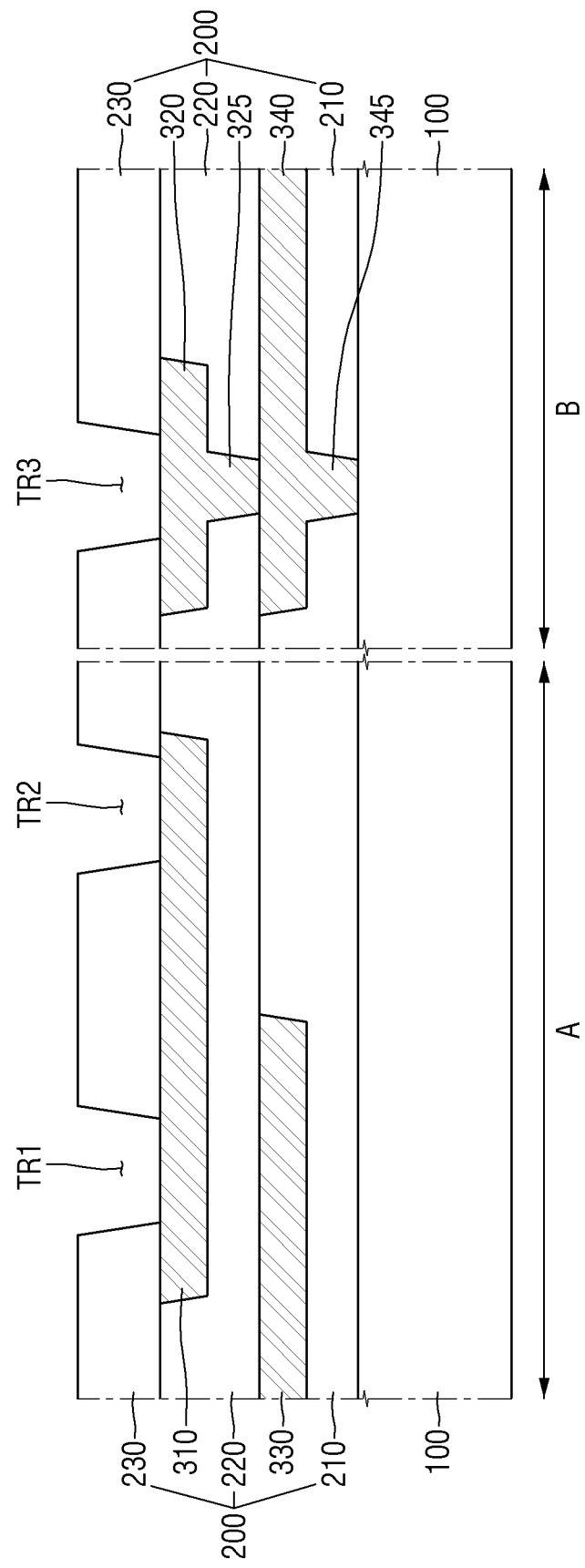
FIGS. 15 to 24 are intermediate stage diagrams for explaining a method for fabricating a semiconductor device according to an example embodiment of the present inventive concepts.

Referring to FIG. 15, an insulating structure 200 and a plurality of conductive layers 310, 320, 330, 340 are provided on a substrate 100.

The insulating structure 200 may include first to third trenches TR1, TR2, TR3. For example, the first to third trenches TR1, TR2, TR3 may be formed by etching a part of the third insulating layer 230.

The first trench TR1 and the second trench TR2 are spaced apart from each other, and may be formed to expose a part of the upper surface of the first conductive layer 310. The third trench TR3 may be formed to expose a part of the upper surface of the second conductive layer 320.

Figure 16:
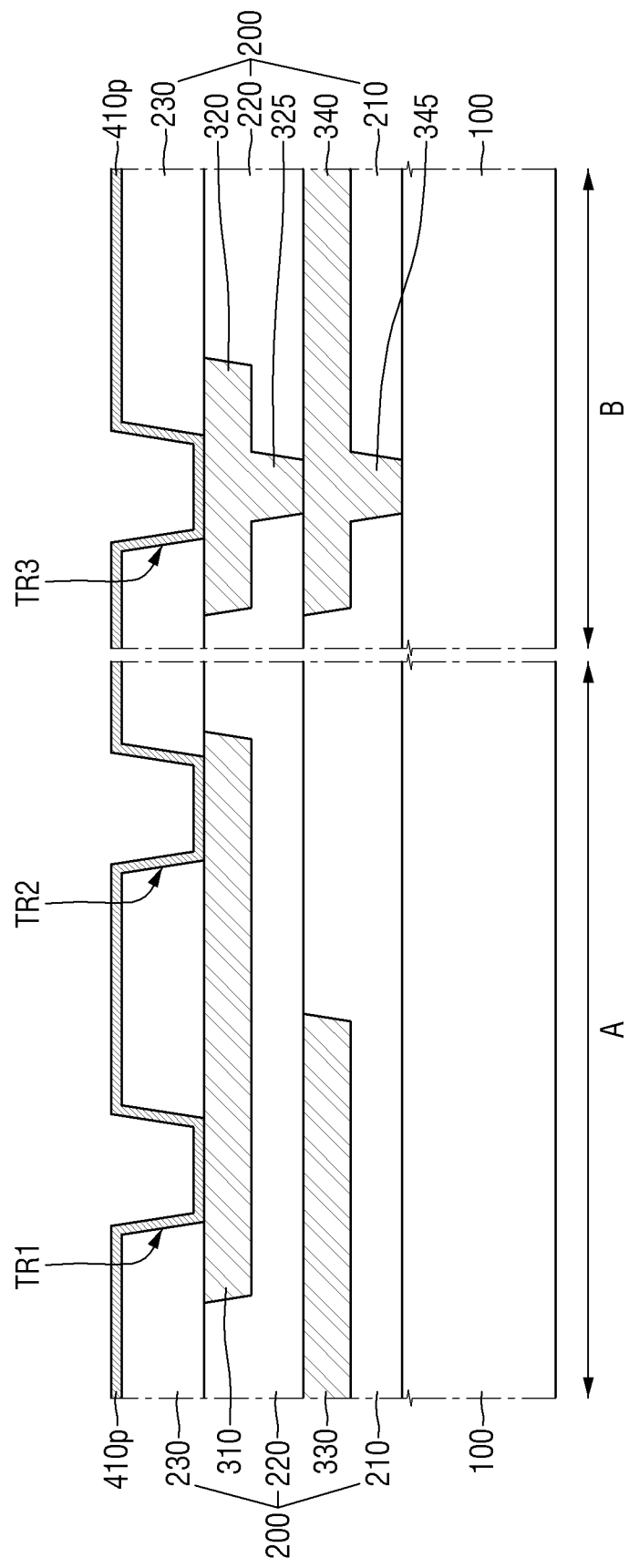

Referring to FIG. 16, a first electrode film 410p is formed on the insulating structure 200 and the first conductive layer 310.

The first electrode film 410p may be conformally formed on the resulting product of FIG. 15. For example, the first electrode film 410p may extend along the profiles of the upper surface of the insulating structure 200 and the sidewalls and bottom surfaces of the first to third trenches TR1, TR2, TR3.

The first electrode film 410p may include, for example, at least one of titanium (Ti), titanium nitride (TiN), tantalum (Ta), tantalum nitride (TaN), tungsten nitride (WN), metal silicide or combinations thereof. In the following description, it is described that the first electrode film 410p includes titanium nitride (TiN).

Figure 17:
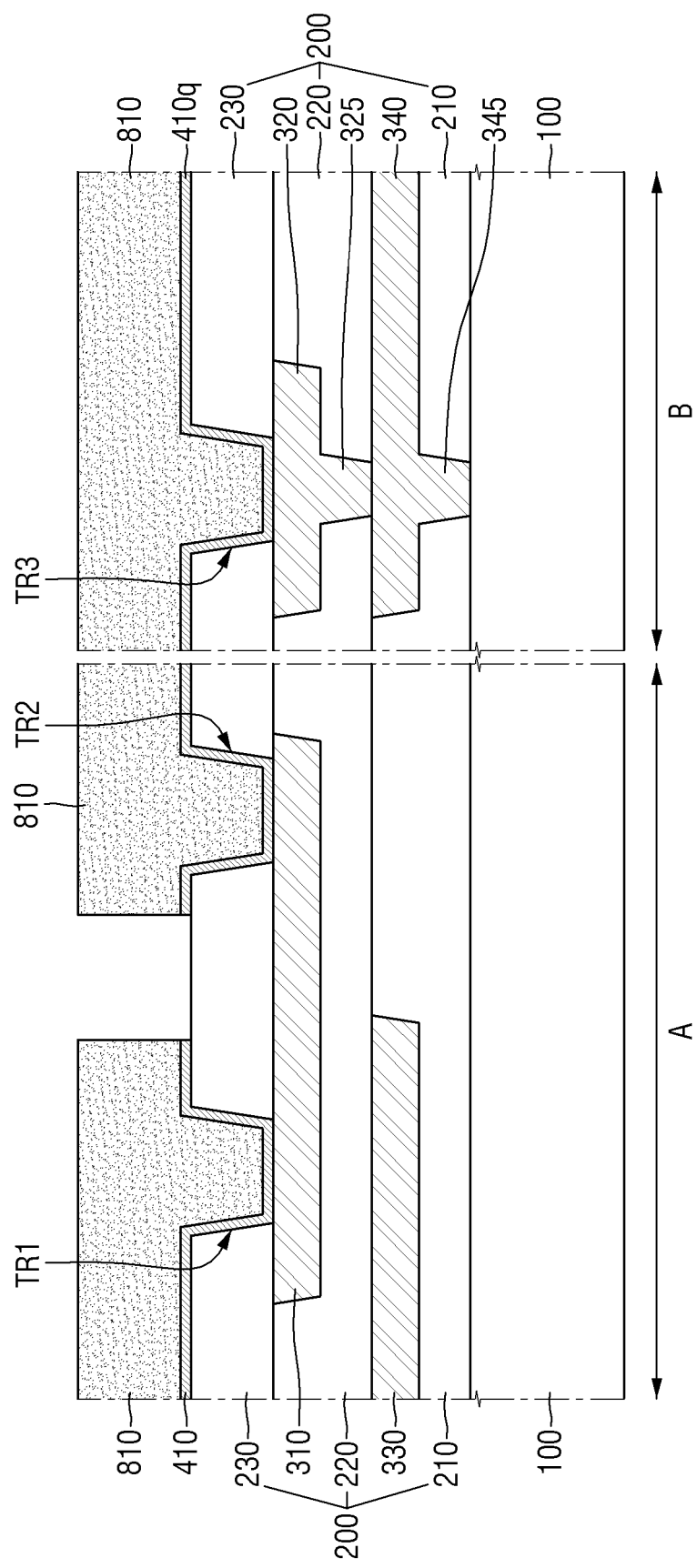

Referring to FIG. 17, the first electrode film 410p is patterned to form the first electrode pattern 410.

Formation of the first electrode pattern 410 may be performed, for example, by a photolithography process. For example, an etching process of using the first mask pattern 810 as an etching mask may be performed. The first mask pattern 810 may cover the first trench TR1 and may expose the first electrode film 410p between the first trench TR1 and the second trench TR2.

The etching process of using the first mask pattern 810 as an etching mask may be performed until the upper surface of the insulating structure 200 is exposed. Therefore, the first electrode pattern 410 extending along the sidewalls and the bottom surface of the first trench TR1 and the upper surface of the insulating structure 200 may be formed.

In some example embodiments, the first mask pattern 810 may further cover the second trench TR2 and/or the third trench TR3. Thus, a sacrificial pattern 410q extending along the sidewalls and the bottom surfaces of the second and third trenches TR2, TR3 may be formed.

After the first electrode pattern 410 is formed, the first mask pattern 810 may be removed.

Figure 18:
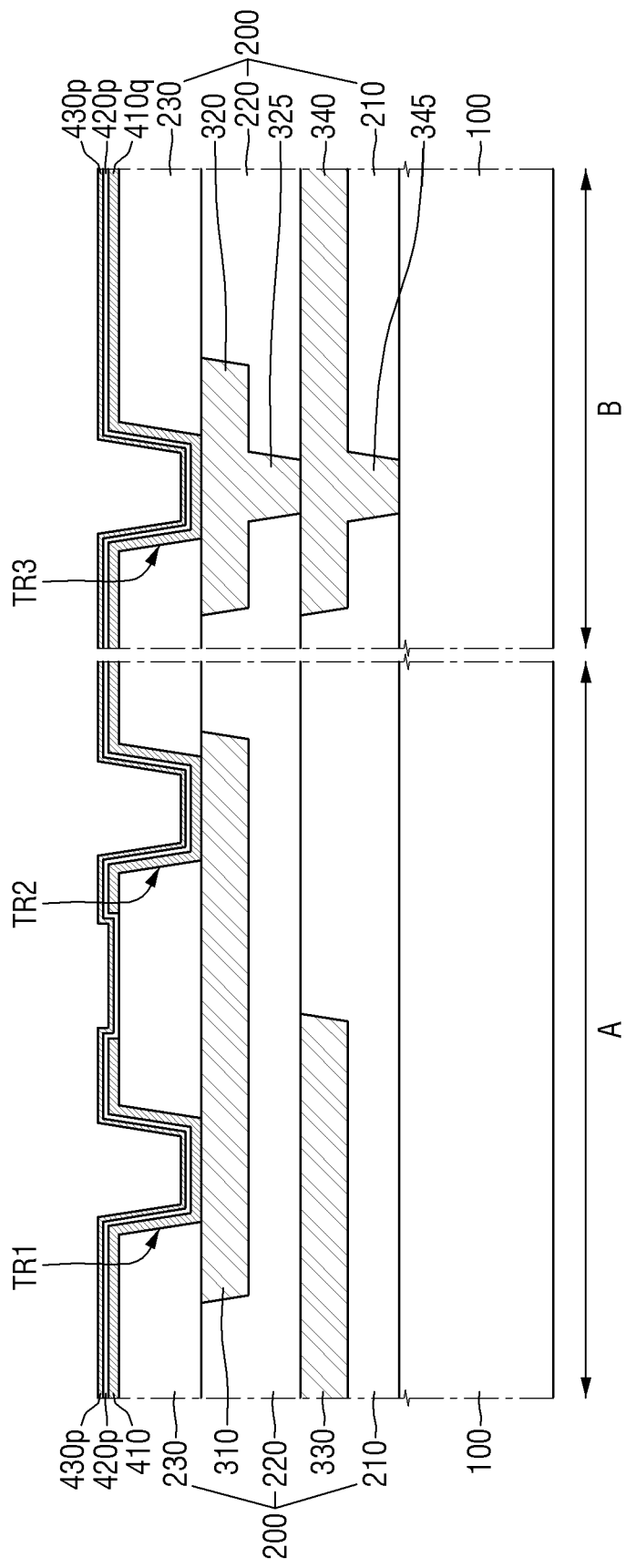

Referring to FIG. 18, a dielectric film 420p and a second electrode film 430p may be formed on the first electrode pattern 410.

The dielectric film 420p and the second electrode film 430p may be sequentially stacked on the first electrode pattern 410. Also, the dielectric film 420p and the second electrode film 430p may be conformally formed on the resulting product of FIG. 15. For example, the dielectric film 420p and the second electrode film 430p may extend along the profiles of the upper surface of the first electrode pattern 410, the upper surface of the insulating structure 200, and the upper surface of the sacrificial pattern 410q.

The dielectric film 420p may include, for example, silicon oxide, silicon nitride, silicon oxynitride, or a high dielectric constant (high-k) material having a higher dielectric constant than silicon oxide.

The second electrode film 430p may include, for example, at least one of titanium (Ti), titanium nitride (TiN), tantalum (Ta), tantalum nitride (TaN), tungsten nitride (WN), metal silicide, or combinations thereof. The first electrode pattern 410 and the second electrode film 430p may include the same material or different materials. In the following description, it is described that both the first electrode pattern 410 and the second electrode film 430p include titanium nitride (TiN).

Figure 19:
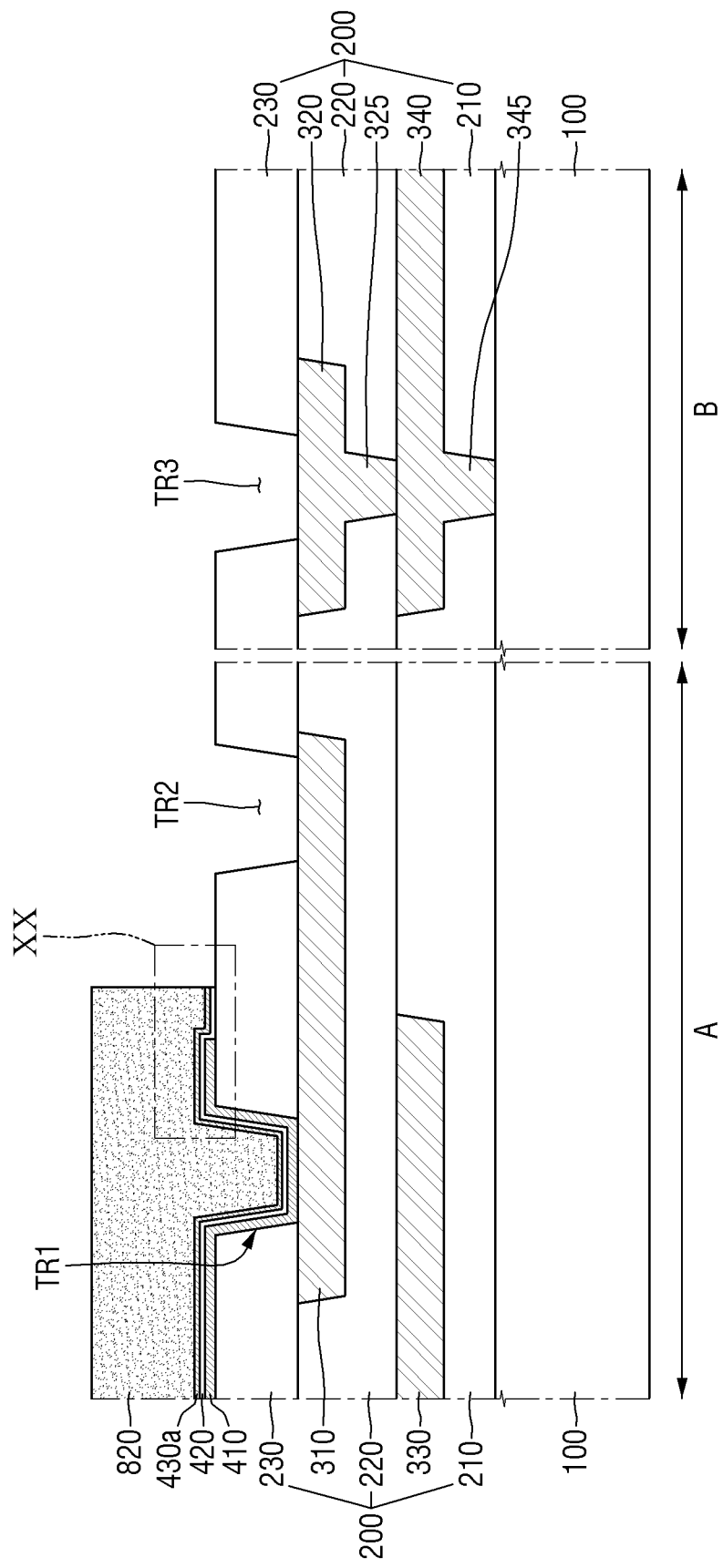
Figure 20:
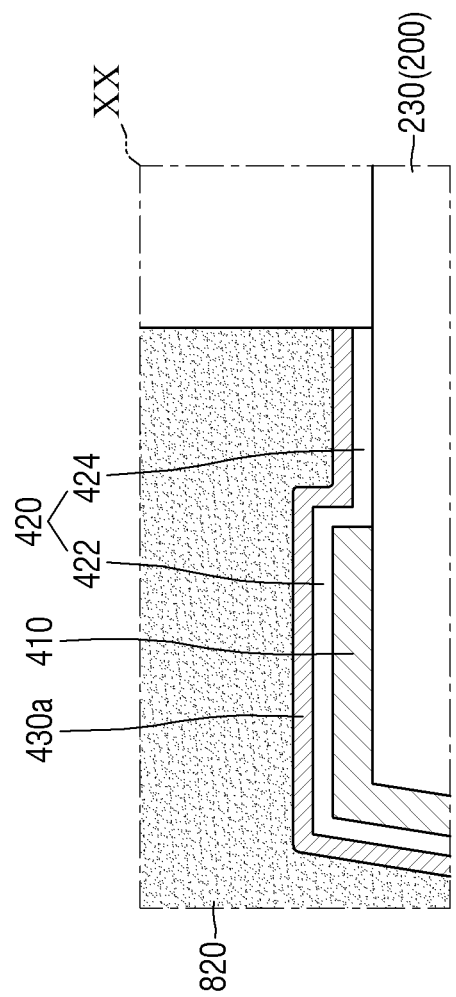

Referring to FIGS. 19 and 20, the dielectric film 420p is patterned to form the dielectric pattern 420 and the lower electrode pattern 430a. For reference, FIG. 20 is an enlarged view of a part 'XX' of FIG. 19.

The formation of the dielectric pattern 420 and the lower electrode pattern 430a may be performed, for example, by a photolithography process. For example, an etching process of using the second mask pattern 820 as an etching mask may be performed. The second mask pattern 820 may cover the first trench TR1, and may expose the second electrode film 430p on the second trench TR2 and the third trench TR3.

The etching process of using the second mask pattern 820 as an etching mask may be performed until the upper surface of the insulating structure 200 is exposed. Thus, the first dielectric pattern 420 and the lower electrode pattern 430a extending along the upper surface of the first electrode pattern 410 may be formed. Further, the sacrificial pattern 410q may be removed.

In some example embodiments, the second mask pattern 820 may extend to be longer than the first electrode pattern 410. For example, the second mask pattern 820 may be formed to protrude from the distal end of the first electrode pattern 410. Thus, the dielectric pattern 420 including a first extension 422 and a first protrusion 424 may be formed.

For example, as illustrated in FIG. 20, the first distance D11 from the first trench TR1 to one distal end of the first electrode pattern 410 may be shorter than the fifth distance D22 from the first trench TR1 to one distal end of the dielectric pattern 420.

After the dielectric pattern 420 and the lower electrode pattern 430a are formed, the second mask pattern 820 may be removed.

Figure 21:
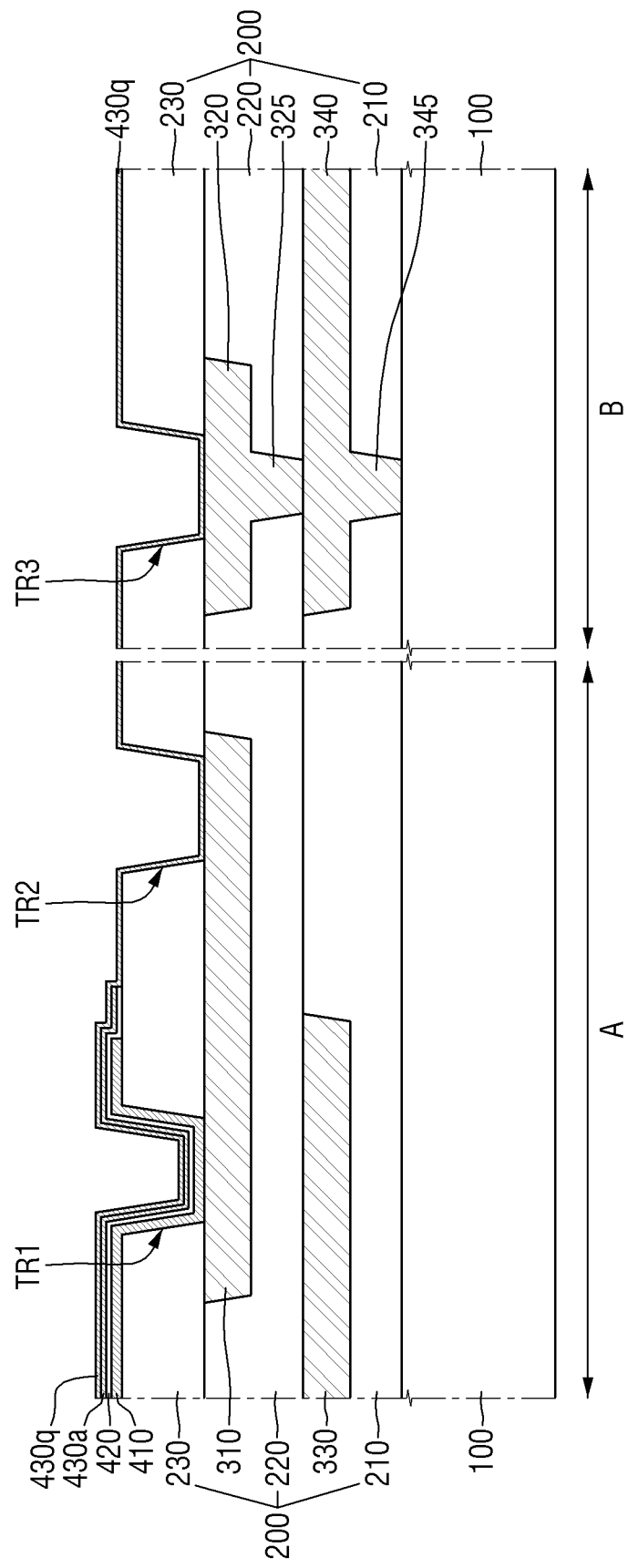

Referring to FIG. 21, a third electrode film 430q is formed on the lower electrode pattern 430a.

The third electrode film 430q may be conformally formed on the resulting product of FIG. 19. For example, the third electrode film 430q may extend along the profiles of the upper surface of the lower electrode pattern 430a, the upper surface of the insulating structure 200, and the sidewalls and the bottom surfaces of the second and third trenches TR2, TR3.

The third electrode film 430q may include, for example, at least one of titanium (Ti), titanium nitride (TiN), tantalum (Ta), tantalum nitride (TaN), tungsten nitride (WN), metal silicide, or combinations thereof. The lower electrode pattern 430a and the third electrode film 430q may include the same material or different materials. In the following description, it is described that both the lower electrode pattern 430a and the third electrode film 430q include titanium nitride (TiN).

Figure 22:
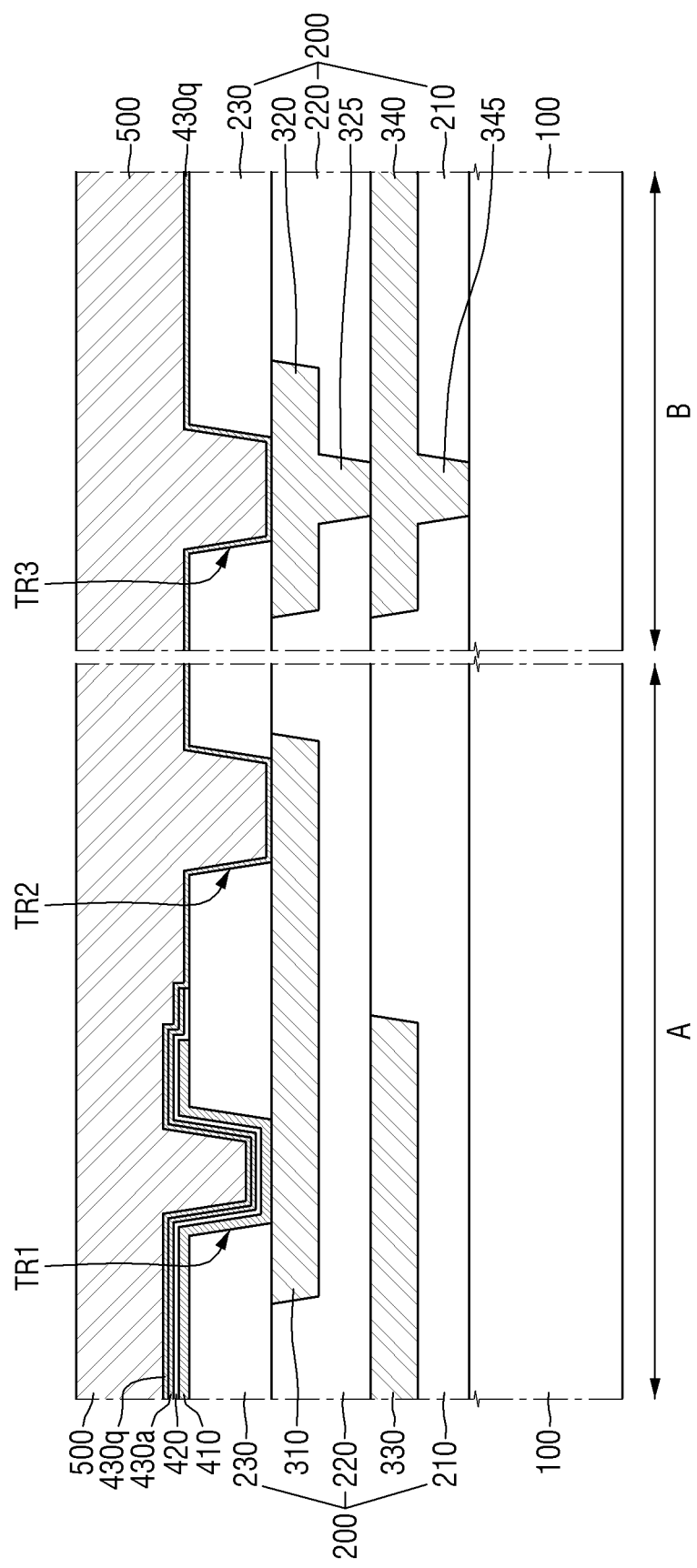

Referring to FIG. 22, a wiring film 500 is formed on the third electrode film 430q.

The wiring film 500 may be formed on the resulting product of FIG. 21. In some example embodiments, the wiring film 500 may be formed to completely fill the first to third trenches TR1, TR2, TR3.

The wiring film 500 may include a conductive material. For example, the wiring film 500 may include, but is not limited to, metals such as tungsten (W), titanium (Ti), tantalum (Ta), copper (Cu), aluminum (Al), or nickel (Ni). In the following description, it is described that the wiring film 500 includes aluminum (Al).

Figure 23:
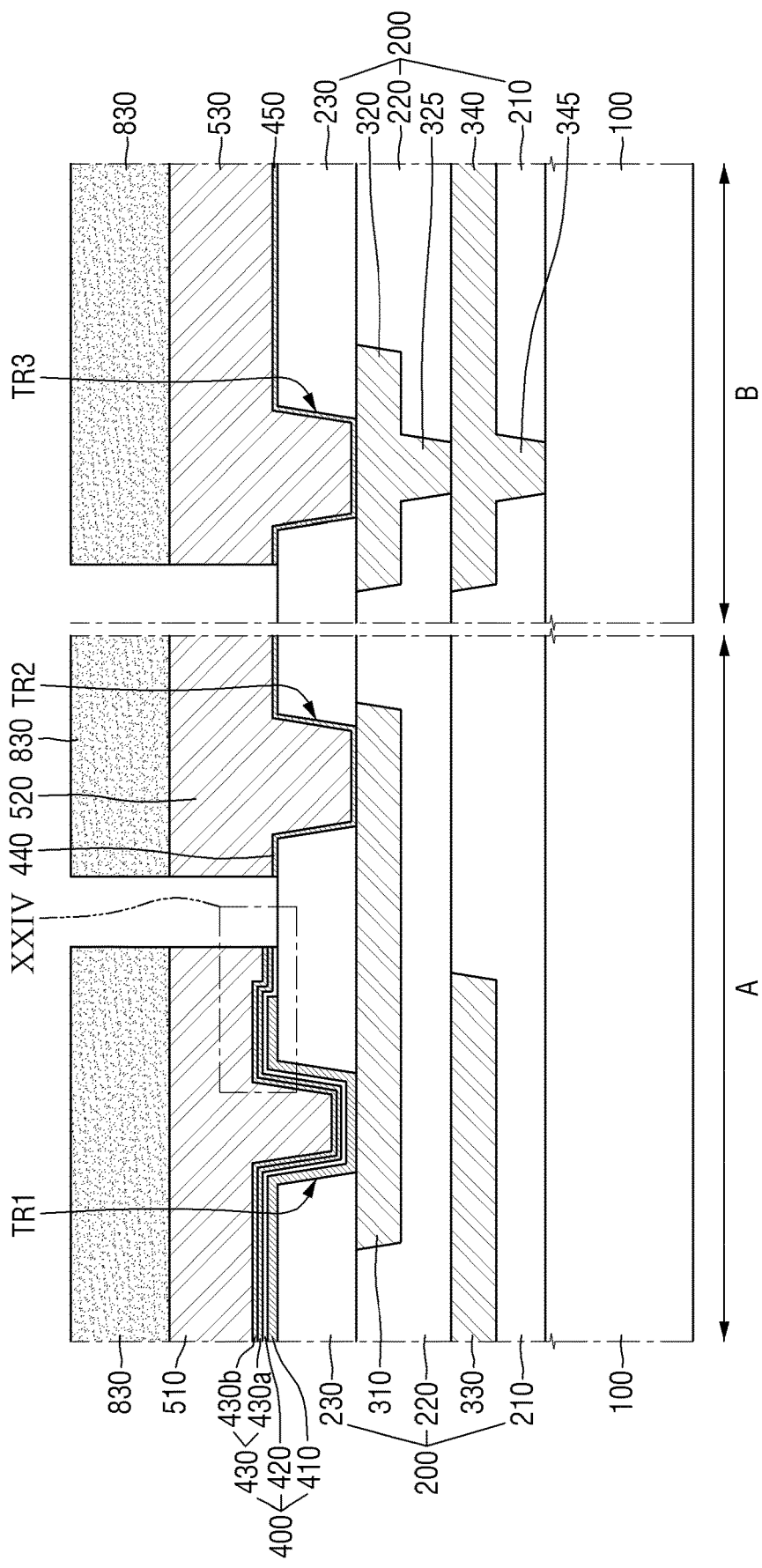
Figure 24:
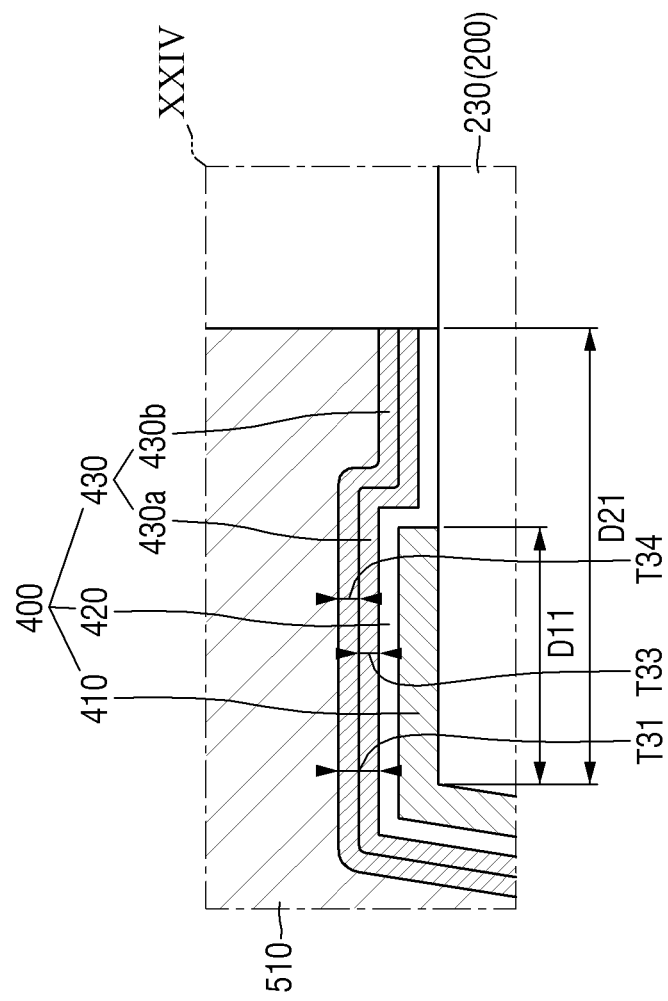

Referring to FIGS. 23 and 24, the wiring film 500 is patterned to form a first wiring pattern 510, a second wiring pattern 520 and a rewiring pattern 530. For reference, FIG. 24 is an enlarged view of a part 'XXIV' of FIG. 23.

Formation of the first wiring pattern 510, the second wiring pattern 520, and the rewiring pattern 530 may be performed by, for example, a photolithography process. For example, an etching process of using the third mask pattern 830 as an etching mask may be performed. The third mask pattern 830 may cover the first to third trenches TR1, TR2, TR3, and may expose the wiring film 500 between the first trench TR1 and the second trench TR2, and the wiring film 500 between the second trench TR2 and the third trench TR3.

Accordingly, the first wiring pattern 510, which fills the first trench TR1 and extends along the upper surface of the insulating structure 200, may be formed. Further, a second wiring pattern 520, which fills the second trench TR2, is spaced apart from the first wiring pattern 510, and extends along the upper surface of the insulating structure 200, may be formed. Further, a rewiring pattern 530 which fills the third trench TR3, is spaced apart from the first and second wiring patterns 510, 520, and extends along the upper surface of the insulating structure 200 may be formed.

In some example embodiments, the capacitor structure 400 may be formed together with the first wiring pattern 510, the second wiring pattern 520, and the rewiring pattern 530. For example, the etching process of using the third mask pattern 830 as an etching mask may be performed until the upper surface of the insulating structure 200 is exposed. Thus, the third electrode film 430q may be patterned to form the upper electrode pattern 430b, the first barrier layer 440, and the second barrier layer 450.

In some example embodiments, the third mask pattern 830 may extend to be longer than the first electrode pattern 410. For example, the third mask pattern 830 may be formed to protrude from the distal end of the first electrode pattern 410. Thus, as illustrated in FIG. 24, the capacitor structure 400 described using FIGS. 1 to 3 may be formed.

The third mask pattern 830 may be removed after the first wiring pattern 510, the second wiring pattern 520, the rewiring pattern 530 and the capacitor structure 400 are formed.

Because the capacitor structure 400 may be formed together with the process of forming the rewiring pattern 530, the capacitor structure 400 may be fabricated by a simplified process. Therefore, it is possible to provide a semiconductor device including a capacitor with improved capacitance by a simplified process.

Figure 25:
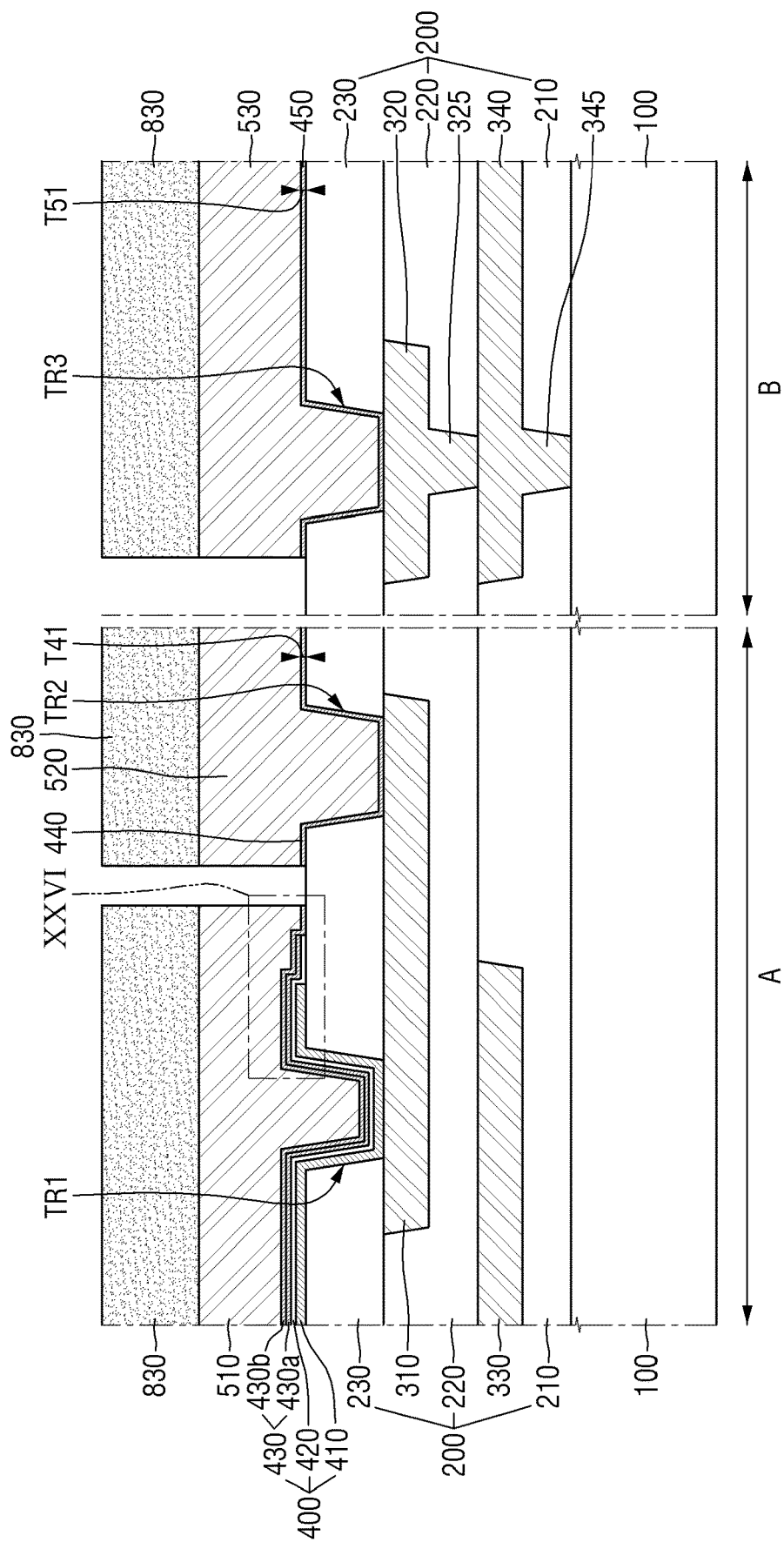
FIG. 25 is an intermediate stage diagram for explaining a method for fabricating a semiconductor device according to an example embodiment of the present inventive concepts.
Figure 26:
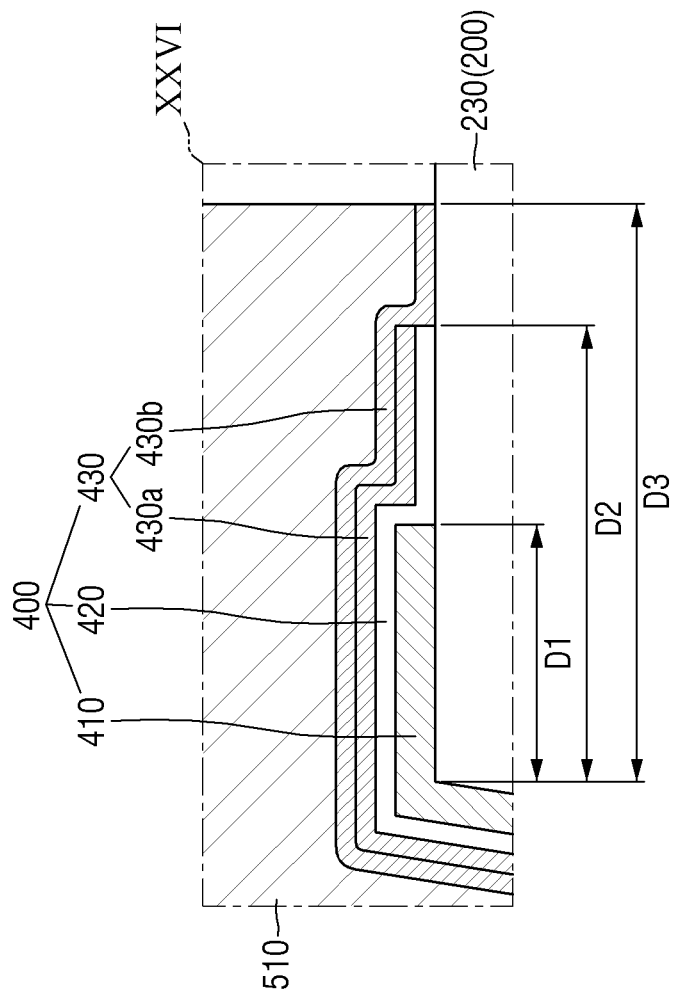
FIG. 26 is an enlarged view of a part 'XXVI' of FIG. 25.

FIG. 25 is an intermediate stage diagram for explaining a method for fabricating a semiconductor device according to an example embodiment of the present inventive concepts. FIG. 26 is an enlarged view of a part 'XXVI' of FIG. 25. Further, FIG. 25 is an intermediate stage diagram for explaining a stage subsequent to FIG. 22.

Referring to FIGS. 25 and 26, the third mask pattern 830 may extend to be longer than the dielectric pattern 420. For example, the third mask pattern 830 may be formed to protrude from the distal end of the dielectric pattern 420. Thus, as illustrated in FIG. 26, the capacitor structure 400 described using FIGS. 4 to 6 may be formed.

Figure 27:
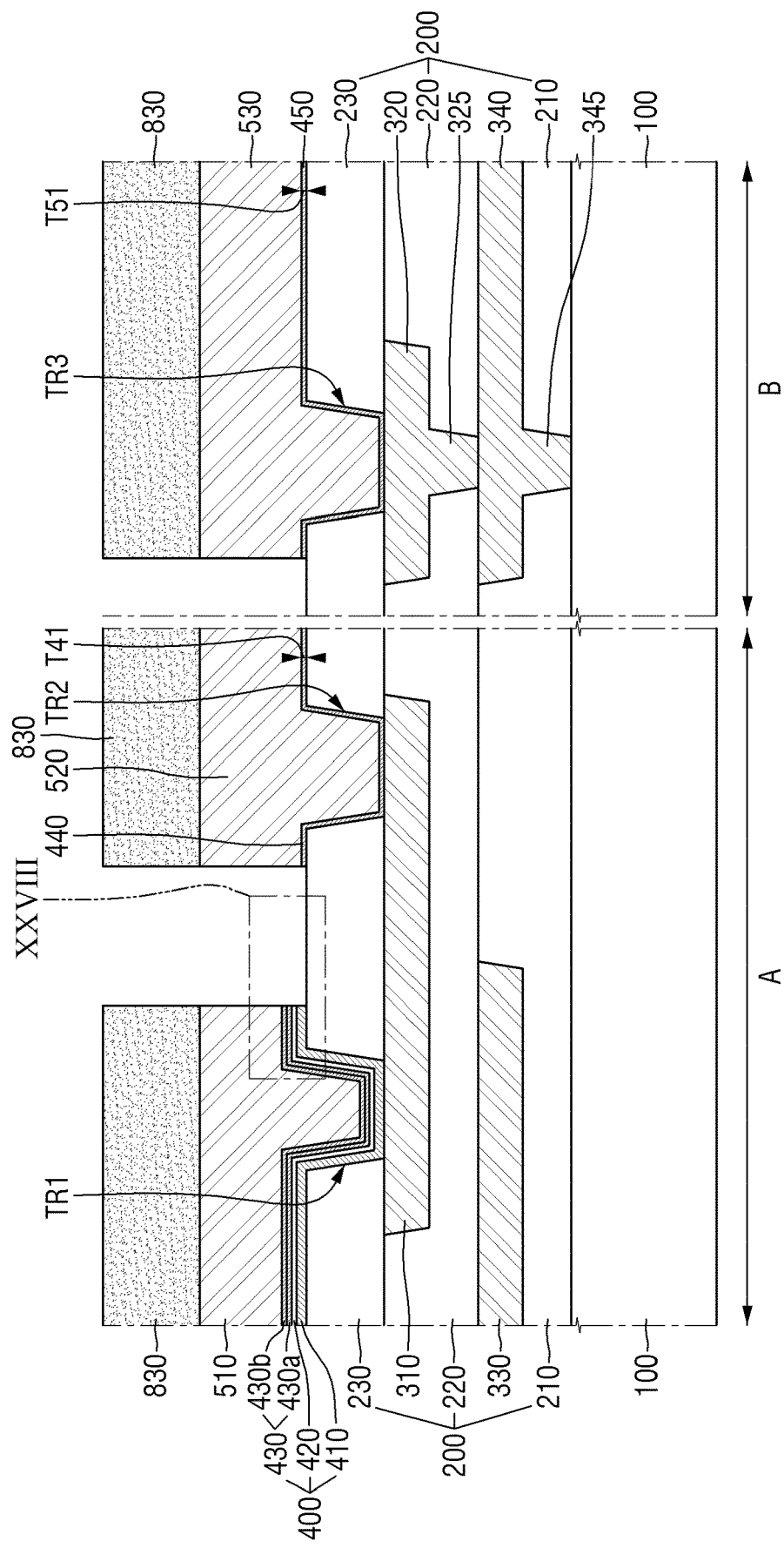
FIG. 27 is an intermediate stage diagram for explaining a method for fabricating a semiconductor device according to an example embodiment of the present inventive concepts.

FIG. 27 is an intermediate stage diagram for explaining a method for fabricating a semiconductor device according to an example embodiment of the present inventive concepts. FIG. 28 is an enlarged view of a part 'XXVII' of FIG. 27. Further, FIG. 27 is an intermediate stage diagram for explaining a stage subsequent to FIG. 22.

Referring to FIGS. 27 and 28, the third mask pattern 830 may extend to be shorter than or the same as the first electrode pattern 410 of FIG. 22. For example, the third mask pattern 830 may be formed to be the same as or to be drawn into the distal end of the first electrode pattern 410 of FIG. 22. Therefore, as illustrated in FIG. 28, the capacitor structure 400 described using FIGS. 7 and 8 may be formed.

In concluding the detailed description, those skilled in the art will appreciate that many variations and modifications may be made to the disclosed example embodiments without substantially departing from the principles of the present inventive concepts. Therefore, the disclosed example embodiments of the invention are used in a generic and descriptive sense only and not for purposes of limitation.

What is claimed is:

1. A semiconductor device comprising:
an insulating structure defining a first trench on a substrate;
a first conductive layer in the insulating structure, a first portion of an upper surface of the first conductive layer exposed by the first trench;
a capacitor structure including a first electrode pattern on the first conductive layer, a dielectric pattern on the first electrode pattern, and a second electrode pattern on the dielectric pattern, the first electrode pattern extending along sidewalls and a bottom surface of the first trench and an upper surface of the insulating structure; and
a first wiring pattern on the capacitor structure,
wherein a first distance from the first trench to a distal end of the first electrode pattern is shorter than a second distance from the first trench to a distal end of the dielectric pattern.

2. The semiconductor device of claim 1, wherein
the dielectric pattern extends along a profile of an upper surface of the first electrode pattern, and
the second electrode pattern extends along a profile of an upper surface of the dielectric pattern.

3. The semiconductor device of claim 1, further comprising:
a second wiring pattern extending along the upper surface of the insulating structure, the second wiring pattern spaced apart from the first wiring pattern, the second wiring pattern connected to a second portion of the upper surface of the first conductive layer.

4. The semiconductor device of claim 3, further comprising:
a barrier layer between the first conductive layer and the second wiring pattern,
wherein the insulating structure further includes a second trench, which is spaced apart from the first trench and exposes the second portion of the upper surface of the first conductive layer, and
the barrier layer extends along sidewalls and a bottom surface of the second trench and the upper surface of the insulating structure.

5. The semiconductor device of claim 1, further comprising:
a second conductive layer spaced apart from the first conductive layer in the insulating structure; and
a rewiring pattern extending along the upper surface of the insulating structure, the rewiring pattern spaced apart from the first wiring pattern, the rewiring pattern connected to an upper surface of the second conductive layer.

6. The semiconductor device of claim 5, further comprising:
a barrier layer between the second conductive layer and the rewiring pattern,
wherein the insulating structure further includes a second trench, which exposes at least a second portion of the upper surface of the second conductive layer, and
the barrier layer extends along sidewalls and a bottom surface of the second trench and along the upper surface of the insulating structure.

7. The semiconductor device of claim 1, wherein the first electrode pattern and the second electrode pattern include titanium nitride (TiN).

8. The semiconductor device of claim 1, wherein the first wiring pattern includes aluminum (Al).

9. A semiconductor device comprising:
a first conductive layer on a substrate;
an insulating structure on the first conductive layer, the insulating structure including a first trench and a second trench, the first trench exposing a first portion of an upper surface of the first conductive layer, the second trench exposing a second portion of the upper surface of the first conductive layer and spaced apart from the first trench;
a capacitor structure extending along sidewalls and a bottom surface of the first trench;
a first wiring pattern on the capacitor structure and extending along an upper surface of the insulating structure; and
a second wiring pattern spaced apart from the first wiring pattern, filling the second trench, and extending along the upper surface of the insulating structure.

10. The semiconductor device of claim 9, further comprising:
a barrier layer extending along sidewalls and a bottom surface of the second trench,
wherein the second wiring pattern extends along an upper surface of the barrier layer.

11. The semiconductor device of claim 10, wherein
the capacitor structure comprises a first electrode pattern on the first conductive layer, a dielectric pattern on the first electrode pattern, and a second electrode pattern on the dielectric pattern, and
the second electrode pattern is thicker than the barrier layer.

12. The semiconductor device of claim 10, wherein
the capacitor structure comprises a first electrode pattern on the first conductive layer, a dielectric pattern on the first electrode pattern, and a second electrode pattern on the dielectric pattern, and
the barrier layer and the second electrode pattern comprise a same material.

13. The semiconductor device of claim 9, wherein a voltage applied to the first wiring pattern is different from a voltage applied to the second wiring pattern.

14. The semiconductor device of claim 9, wherein the first wiring pattern and the second wiring pattern comprise a same material.

15. The semiconductor device of claim 9, further comprising:
a second conductive layer in the insulating structure and spaced apart from the first conductive layer; and
a rewiring pattern extending along an upper surface of the insulating structure, the rewiring pattern spaced from the first wiring pattern the rewiring pattern connected to an upper surface of the second conductive layer.

16. A semiconductor device comprising:
an insulating structure defining a first trench, on a substrate;
a first conductive layer in the insulating structure, a first portion of an upper surface of the first conductive layer exposed by the first trench;
a first electrode pattern extending along sidewalls and a bottom surface of the first trench;
a dielectric pattern covering an upper surface and sidewalls of the first electrode pattern;
a second electrode pattern extending along an upper surface of the dielectric pattern; and
a first wiring pattern extending along an upper surface of the second electrode pattern.

17. The semiconductor device of claim 16, wherein the dielectric pattern comprises a first extension extending along the upper surface of the first electrode pattern, and a first protrusion protruding from the first extension and covering the sidewalls of the first electrode pattern.

18. The semiconductor device of claim 17, wherein the second electrode pattern comprises a second extension extending along the upper surface of the first extension, and a second protrusion protruding from the second extension and extending along an upper surface of the first protrusion.

19. The semiconductor device of claim 17, wherein the first protrusion is in direct contact with an upper surface of the insulating structure.

* * * * *